(12) United States Patent
Yun et al.

(10) Patent No.: US 12,738,336 B2
(45) Date of Patent: Sep. 15, 2026

(54) SHIFT REGISTERS

(71) Applicant: SK hynix Inc., Icheon-si (KR)

(72) Inventors: Seong Jin Yun, Icheon-si (KR); Jeong Pyo Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 6 days.

(21) Appl. No.: 19/062,533

(22) Filed: Feb. 25, 2025

(65) Prior Publication Data

US 2026/0011385 A1 Jan. 8, 2026

(30) Foreign Application Priority Data

Jul. 4, 2024 (KR) ........................ 10-2024-0088533

(51) Int. Cl.
*G11C 19/28* (2006.01)

(52) U.S. Cl.
CPC .................................... *G11C 19/28* (2013.01)

(58) Field of Classification Search
CPC ....... G11C 19/28; G11C 19/00; G11C 19/287; H03K 19/0013; H03K 19/01721
See application file for complete search history.

(56) References Cited

U.S. PATENT DOCUMENTS 7,889,832 B2 * 2/2011 Otose ..................... G11C 19/28 377/67
11,545,094 B2 * 1/2023 Liu ........................ G11C 19/28
11,749,161 B2 * 9/2023 Miao ...................... G11C 19/28 345/213
11,837,147 B2 * 12/2023 Sun ...................... G09G 3/3266
2017/0193888 A1 * 7/2017 Moon ...................... G09G 3/36

FOREIGN PATENT DOCUMENTS

KR 20150028493 A 3/2015

* cited by examiner

*Primary Examiner* — Cassandra F Cox

(57) ABSTRACT

A shift register includes a pre-stage configured to output a pre-voltage signal based on a clock signal and a reset signal, and "N" shift-stages configured to receive the clock signal, and output "N" output signals, respectively. The pre-stage and the "N" shift-stages are coupled in a daisy-chain form. Odd-numbered shift-stages among the "N" shift-stages are configured with the same first circuit structure, and even-numbered shift-stages among the "N" shift-stages are configured with the same second circuit structure.

32 Claims, 11 Drawing Sheets

Figure 1:
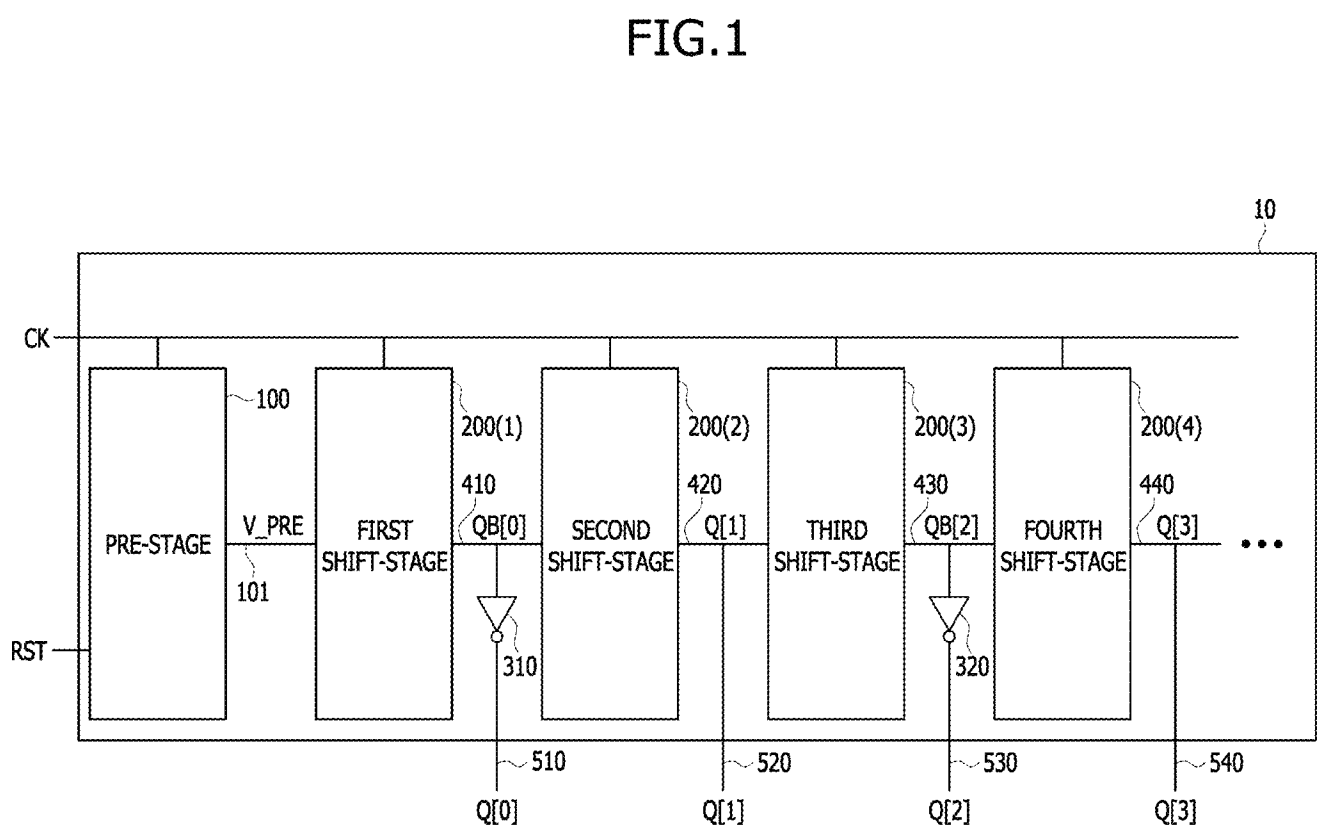

RST

PRE-STAGE 100

V_PRE 101

FIRST SHIFT-STAGE 200(1)

410 QB[0]

310

510 Q[0]

SECOND SHIFT-STAGE 200(2)

420 Q[1]

520 Q[1]

THIRD SHIFT-STAGE 200(3)

430 QB[2]

320

530 Q[2]

FOURTH SHIFT-STAGE 200(4)

SHIFT REGISTERS

CROSS-REFERENCE TO RELATED APPLICATIONS

The present application claims priority under 35 U.S.C § 119 (a) to Korean Application No. 10-2024-0088533, filed in the Korean Intellectual Property Office on Jul. 4, 2024, the entire contents of which are incorporated herein by reference.

BACKGROUND

1. Technical Field

The present disclosure relates to shift registers, and more particularly, to shift registers with a small circuit area.

2. Related Art

A shift register is a type of digital memory device that typically contains several flip-flops, also known as latches or non-stable gates, in a serial daisy-chain configuration. Data in the form of binary digits (bits) enters the shift register at one end and comes out from the other end. Data bits are either clocked in or clocked out using a clock signal that advances the data from one flip-flop to the next in the chain. Data may be loaded into or read out from the shift register serially in this manner. In general, a shift register may be defined as having a specific length or number of bits, depending on the number of flip-flops in the register. For example, a 12-bit shift register has 12 flip-flops that are daisy-chained in series. However, the flip-flops constituting the shift register, such as D-flip-flops, each includes approximately 26 transistors. Accordingly, the greater the number of stages in the shift register, the greater the circuit area required and the greater the dynamic current consumption.

SUMMARY

A shift register according to an embodiment of the present disclosure may include a pre-stage configured to output a pre-voltage signal based on a clock signal and a reset signal, and "N" shift-stages ("N" is a natural number equal to or greater than 2) configured to receive the clock signal, and output "N" output signals, respectively. The pre-stage and the "N" shift-stages may be coupled in a daisy-chain form. Odd-numbered shift-stages among the "N" shift-stages may be configured with the same first circuit structure, and even-numbered shift-stages among the "N" shift-stages may be configured with the same second circuit structure.

A shift register according to an embodiment of the present disclosure may include a clock division circuit configured to receive a clock signal and output a divided clock signal having a different cycle from the clock signal, a pre-stage configured to output a pre-voltage signal based on the divided clock signal and a reset signal, and "N" shift-stages configured to receive the divided clock signal, and output "N" output signals, respectively ("N" is a natural number greater than or equal to 2). The pre-stage and the "N" shift-stages may be coupled in a daisy-chain form. Odd-numbered stages among the "N" shift-stages may be configured with the same first circuit structure, and even-numbered shift-stages among the "N" shift-stages may be configured with the same second circuit structure different from the first circuit structure.

BRIEF DESCRIPTION OF THE DRAWINGS

Certain features of the disclosed technology are illustrated by various embodiments with reference to the attached drawings.

FIG. 1 is a block diagram illustrating a shift register according to an embodiment of the present disclosure.

FIG. 2 is a circuit diagram illustrating a circuit configuration of a pre-stage and first to third shift-stages included in a shift register according to an embodiment of the present disclosure.

FIG. 4 is a circuit diagram illustrating an operation of a shift register according to an embodiment of the present disclosure.

FIG. 5 is a circuit diagram illustrating an operation of a shift register according to an embodiment of the present disclosure.

FIG. 6 is a circuit diagram illustrating an operation of a shift register according to an embodiment of the present disclosure.

FIG. 7 is a circuit diagram illustrating an operation of a shift register according to an embodiment of the present disclosure.

DETAILED DESCRIPTION

Figure 3:
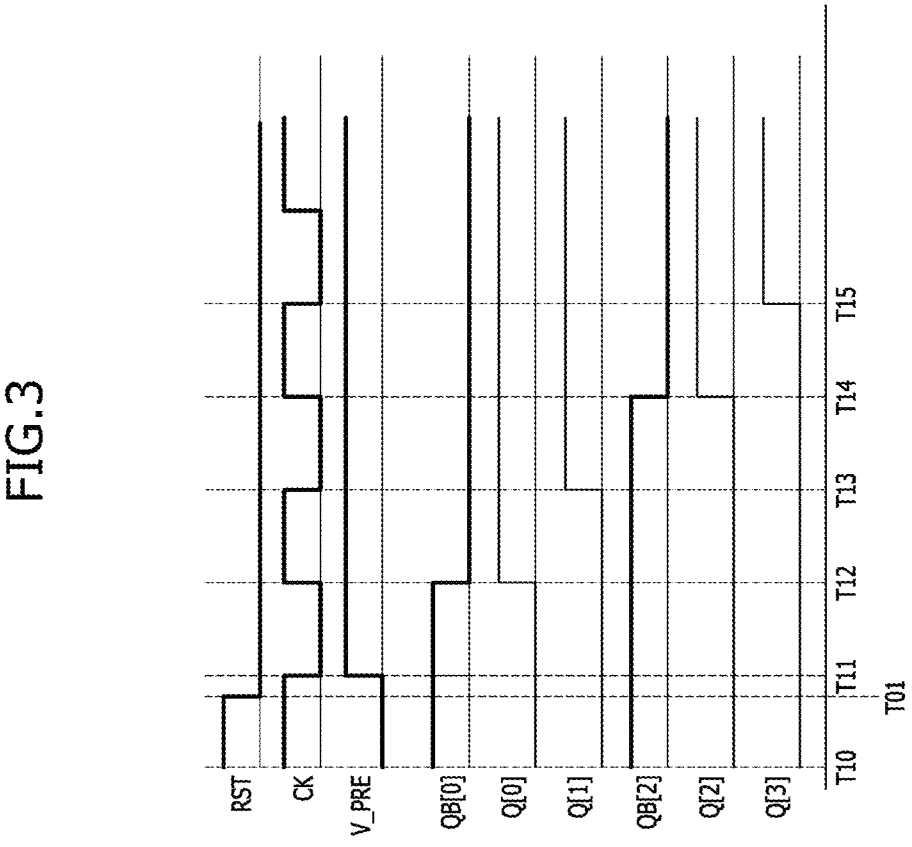
FIG. 3 is a timing diagram during a shifting operation of a shift register according to an embodiment of the present disclosure.

Terms such as "first" and "second" are used to distinguish between various elements and do not imply size, order, priority, quantity, or importance of the elements. For example, a first element may be referred to as a second element in one example, and the second element may be referred to as a first element in another example.

When an element is referred to as "connected" to another element, the elements may be connected directly or through one or more intervening elements. When two elements are referred to as "directly connected" one element is directly connected to the other element without an intervening element between the two elements.

Terms such as "over," "on," "inside," "higher," "high," "low," "left," "right," "column," "row," "level," and other terms implying relative spatial relationship or orientation are utilized in the specification only for the purpose of ease of description or reference to a drawing and are not otherwise limiting.

A logic "high" level and a logic "low" level may be used to describe logic levels of electric signals. A signal having a logic "high" level may be distinguished from a signal at a logic "low" level. For example, when a signal having a first voltage corresponds to a signal at a logic "high" level, a signal having a second voltage may correspond to a signal at a logic "low" level. In an embodiment, the logic "high" level may be set as a voltage level that is higher than a voltage level of the logic "low" level. Logic levels of signals may be set to be different or opposite according to embodiment. For example, a certain signal at a logic "high" level in one embodiment may be set to be at a logic "low" level in another embodiment.

The term "bit set" includes a combination of logic levels of bits included in a signal. When the logic level of the bits included in the signal is changed, the bit set of the signal is different. For example, when the signal includes a first combination of two bits, the logic bit set of the signal is a first bit set, and when the signal includes a second combination of two bits, the bit set of the signal is a second bit set.

Embodiments of the present disclosure are described in detail with reference to the accompanying drawings. Specific structural or functional descriptions of embodiments are provided as examples for illustrative purposes to describe concepts that are disclosed in the present application. Examples or embodiments in accordance with the concepts may be carried out in various forms, and the scope of the present disclosure is not limited to the examples or embodiments described in this specification.

FIG. 1 is a block diagram illustrating a shift register according to an embodiment of the present disclosure.

Referring to FIG. 1, a shift register 10 receives a clock signal CK and a reset signal RST through a first input terminal and a second input terminal, respectively. In an embodiment, the clock signal CK is provided from a circuit external to the shift register 10, such as a reference clock signal generation circuit. The shift register 10 includes a plurality of shift output lines 510, 520, 530, 540, . . . that output a plurality of shift output signals Q[0], Q[1], Q[2], Q[3], . . . , respectively. The shift register 10 performs an edge-based shifting operation in which binary information is shifted each time an edge of the clock signal CK occurs. That is, the shift register 10 performs the shifting operation at each rising edge or falling edge of the clock signal CK input to the shift register 10. Accordingly, a cycle in which the shifting operation is performed in the shift register 10 becomes half the cycle of the clock signal CK.

The shift register 10 includes a pre-stage 100, a plurality of shift-stages 200(1), 200(2), 200(3), 200(4), . . . , and a plurality of output inverters 310, 320, . . . . The number of plurality of shift-stages 200(1), 200(2), 200(3), 200(4), . . . is equal to or greater than the number of shift output signals Q[0], Q[1], Q[2], Q[3], . . . output from the shift register 10. The number of output inverters 310, 320, . . . is equal to or greater than the number of odd-numbered shift output signals Q[0], Q[2], . . . among the shift output signals Q[0], Q[1], Q[2], Q[3], . . . that are output from the shift register 10. For example, the shift register 10 that outputs "N" shift output signals Q[N−1:0] ("N" is a natural number greater than or equal to 2) includes at least "N" shift-stages and at least "N/2" output inverters.

The pre-stage 100 and the plurality of shift-stages 200(1), 200(2), 200(3), 200(4), . . . are connected in a daisy-chain form (or serial form). Accordingly, a signal output from the pre-stage 100 is input to a first shift-stage 200(1). In addition, a signal output from an "M"$^{th}$ shift-stage ("M" is a natural number greater than or equal to 1 and less than or equal to "N−1") among the "N" shift-stages, for example, first to "N"$^{th}$ shift-stages, is input to an "M+1"$^{th}$ shift-stage. The signals output from odd-numbered shift-stages 200(1), 200(3), . . . among the plurality of shift-stages 200(1), 200(2), 200(3), 200(4), . . . are also input to the plurality of output inverters 310, 320, . . . , respectively. Accordingly, the signals output from the odd-numbered shift-stages 200(1), 200(3), . . . are output from the shift register 10 after being inverted by the plurality of output inverters 310, 320, . . . . On the other hand, the signals output from even-numbered shift-stages 200(2), 200(4), . . . among the plurality of shift-stages 200(1), 200(2), 200(3), 200(4), . . . are directly output from the shift register 10.

As illustrated in FIG. 1, an output signal V_PRE of the pre-stage 100 is input to the first shift-stage 200(1). The output signal QB[0] of the first shift-stage 200(1) is input to the second shift-stage 200(2) and the output inverter 310. The output signal Q[1] of the second shift-stage 200(2) is input to the third shift-stage 200(3). In addition, the output signal QB[2] of the third shift-stage 200(3) is input to the fourth shift-stage 200(4) and the output inverter 320. Although omitted from FIG. 1, the output signal Q[3] of the fourth shift-stage 200(4) is input to the fifth shift-stage.

The pre-stage 100 of the shift register 10 receives the clock signal CK and the reset signal RST. The pre-stage 100 outputs a pre-voltage signal V_PRE as an output signal through an output line 101. The pre-stage 100 maintains the logic level of the pre-voltage signal V_PRE at a second logic level (hereinafter, referred to as "low level") while the reset signal RST is at a first logic level (hereinafter, referred to as "high level"). The pre-stage 100 transitions the logic level of the pre-voltage signal V_PRE from a low level to a high level at an edge generation time (hereinafter, referred to as "first edge time") when an edge occurs, at which time the logic level of the clock signal CK is changed from a high level to a low level while the logic level of the reset signal RST is changed from a high level to a low level. The pre-stage 100 maintains the logic level of the pre-voltage signal V_PRE at a low level, from a time when the logic level of the reset signal RST is changed from a high level to a low level to the first edge time. After the first edge time, the logic level of the pre-voltage signal V_PRE output from the pre-stage 100 is maintained at a high level. The pre-stage 100 transmits the pre-voltage signal V_RPE to the first shift-stage 200(1).

The plurality of shift-stages 200(1), 200(2), 200(3), 200(4), . . . receive the clock signal CK in common. The odd-numbered shift-stages 200(1), 200(3), . . . among the plurality of shift-stages 200(1), 200(2), 200(3), 200(4), . . . output inverted signals QB[0], QB[2], . . . as the output signals, respectively. The inverted signals QB[0], QB[2], . . . output from the odd-numbered shift-stages 200(1), 200(3), . . . have values obtained by inverting binary values of the odd-numbered shift output signals Q[0], Q[2], . . . , respectively, among the plurality of shift output signals Q[0], Q[1], Q[2], Q[3], . . . output from the shift register 10. On the other hand, the even-numbered shift-stages 200(2), 200(4), . . . among the plurality of shift-stages 200(1), 200(2), 200(3), 200(4), . . . output even-numbered shift output signals Q[1], Q[3], . . . among the plurality of shift output signals Q[0], Q[1], Q[2], Q[3], . . . output from the shift register 10 as the output signals, respectively.

As illustrated in FIG. 1, the first shift-stage 200(1), which is the first of the odd-numbered shift-stages 200(1), 200(3), . . . , outputs the inverted signal QB[0] through an output line 410. The inverted signal QB[0] output through the output line 410 of the first shift-stage 200(1) is input to the second shift-stage 200(2) and the output inverter 310. The output inverter 310 has an input terminal coupled to the output line 410 and an output terminal coupled to a first shift output line 510 of the shift register 10. The output inverter 310 outputs a signal obtained by inverting a binary value of the inverted signal QB[0] as a first shift output signal Q[0] of the shift register 10. The first shift output signal Q[0]

output from the output inverter 310 is output from the shift register 10 through the first shift output line 510 of the shift register 10.

The second shift-stage 200(2), which is the first of the even-numbered shift-stages 200(2), 200(4), . . . , outputs a second shift output signal Q[1] through an output line 420. The second shift output signal Q[1] output through the output line 420 of the second shift-stage 200(2) is output from the shift register 10 through a second shift output line 520 of the shift register 10.

The third shift-stage 200(3), which is the second of the odd-numbered shift-stages 200(1), 200(3), . . . , outputs the inverted signal QB[2] through an output line 430. The inverted signal QB[2] output through the output line 430 of the third shift-stage 200(3) is input to the fourth shift-stage 200(4) and the output inverter 320. The output inverter 320 has an input terminal coupled to the output line 430 of the third shift-stage 200(3) and an output terminal coupled to a third shift output line 530 of the shift register 10. The output inverter 320 outputs a signal obtained by inverting a binary value of the inverted signal QB[2] as a third shift output signal Q[2] of the shift register 10. The third shift output signal Q[2] output from the output inverter 320 is output from the shift register 10 through the third shift output line 530.

The fourth shift-stage 200(4), which is the second of the even-numbered shift-stages 200(2), 200(4), . . . , outputs a fourth shifted output signal Q[3] through an output line 440. The fourth shifted output signal Q[3] output through the output line 440 of the fourth shift-stage 200(4) is output from the shift register 10 through a fourth shift output line 540.

Each of the odd-numbered shift-stages 200(1), 200(3), . . . may be configured in the same circuit structure, for example, a first circuit structure. In an embodiment, each of the odd-numbered shift-stages 200(1), 200(3), . . . includes two inverters, two p-channel type MOS (hereinafter, referred to as "PMOS") transistors, and two N-channel type MOS (hereinafter, referred to as "NMOS") transistors. Similarly, each of the even-numbered shift-stages 200(2), 200(4), . . . may be configured in the same second circuit structure that is different from the first circuit structure. In an embodiment, each of the even-numbered shift-stages 200 (2), 200(4), . . . includes two inverters, two PMOS transistors, and two NMOS transistors. In an embodiment, the pre-stage 100 may be configured in the same circuit structure as each of the even-numbered shift-stages 200(2), 200(4), . . . , that is, the second circuit structure. Accordingly, the pre-stage 100 also includes two inverters, two PMOS transistors, and two NMOS transistors.

Figure 2:
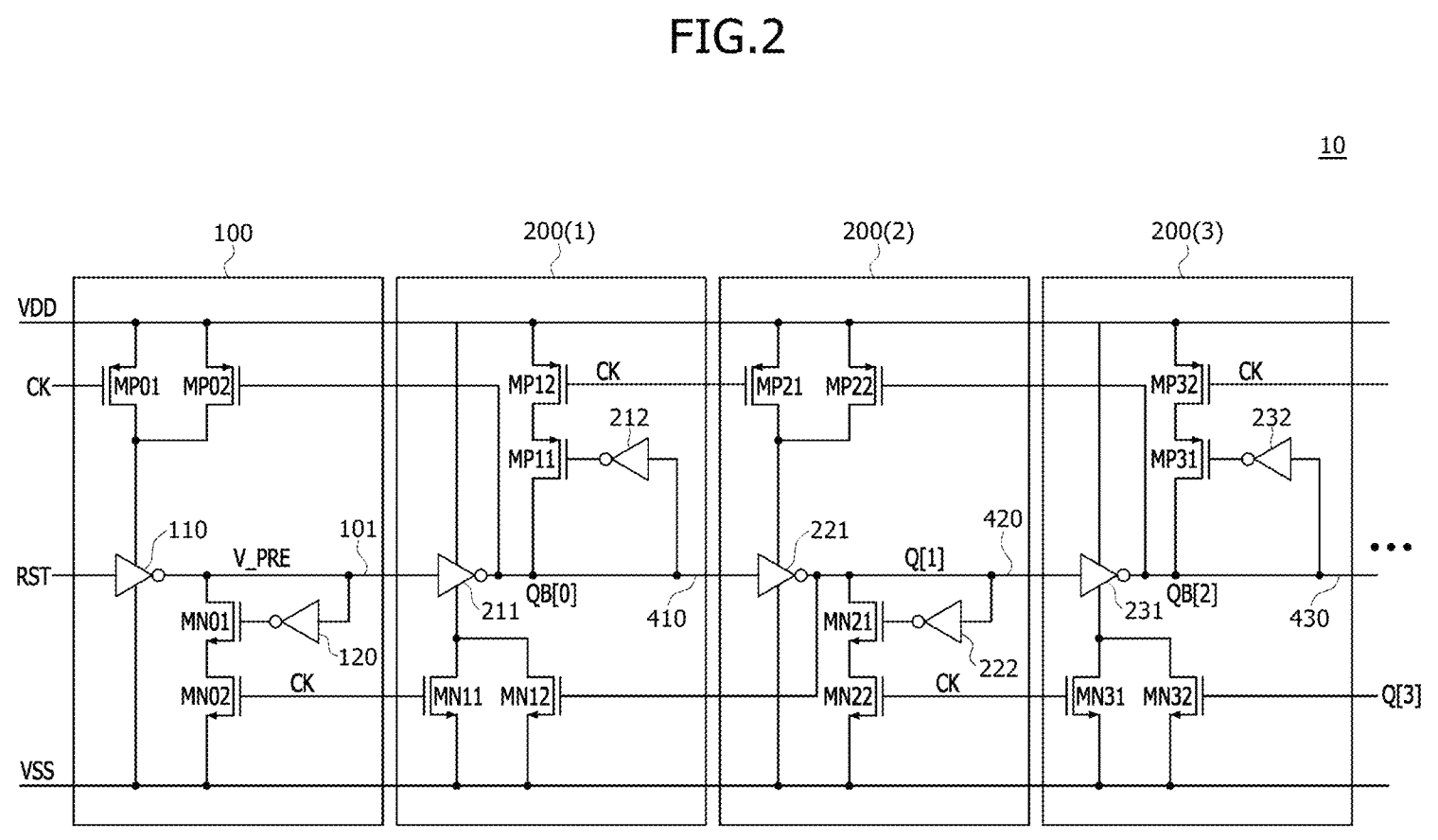

FIG. 2 is a circuit diagram illustrating a circuit configuration of a pre-stage and first to third shift-stages included in a shift register according to an embodiment of the present disclosure, for example, as shown in FIG. 1. In FIG. 2, the same reference numerals used in FIG. 1 represent the same components.

Referring to FIG. 2, a pre-stage 100 of a shift register 10 receives a clock signal CK, a reset signal RST, and an inverted signal QB[0] output from a first shift-stage 200(1). The pre-stage 100 outputs a pre-voltage signal V_PRE applied to an output line 101. In an embodiment, the pre-stage 100 includes a first inverter 110, a second inverter 120, a first PMOS transistor MP01, a second PMOS transistor MP02, a first NMOS transistor MN01, and a second NMOS transistor MN02. Although not shown in FIG. 2, the first inverter 110 may include a pull-up transistor, for example, a PMOS transistor, and a pull-down transistor, for example, an NMOS transistor. A gate terminal of the PMOS transistor and a gate terminal of the NMOS transistor are commonly coupled to an input terminal of the first inverter 110. A source terminal of the PMOS transistor is coupled to a pull-up voltage, for example, a supply voltage VDD. A source terminal of the NMOS transistor is coupled to a pull-down voltage, for example, a ground voltage VSS. A drain terminal of the PMOS transistor and a drain terminal of the NMOS transistor are commonly coupled to an output terminal of the first inverter 110. The second inverter 120 may be configured in the same manner as the first inverter 110. Hereinafter, the source terminal of the PMOS transistor and the source terminal of the NMOS transistor of each of the first inverter 110 and the second inverter 120 is referred to as "pull-up terminal" and "pull-down terminal," respectively. The pull-down terminals of the first inverter 110 and second inverter 120 are enabled when the logic level of an input signal is at a high level. Description of a structure of the first inverter 110 of the pre-stage 100 may be equally applied to the first inverter and the second inverter of each of first to third shift-stages 200(1), 200(2), 200(3), . . . .

The first inverter 110 of the pre-stage 100 has the input terminal, the pull-up terminal, the pull-down terminal, and the output terminal. The first inverter 110 receives the reset signal RST through the input terminal. The pull-up terminal of the first inverter 110 is coupled to the supply voltage VDD through the first PMOS transistor MP01 or the second PMOS transistor MP02. The pull-down terminal of the first inverter 110 is directly coupled to the output line 101 of the pre-stage 100. The first inverter 110 outputs, through the output terminal, a signal applied to the pull-up terminal or a signal applied to the pull-down terminal as the inverted signal.

The second inverter 120 of the pre-stage 100 has an input terminal and an output terminal. Although not shown in FIG. 2, the second inverter 120 has a pull-up terminal and a pull-down terminal that are directly coupled to the supply voltage VDD and the ground voltage VSS, respectively. The input terminal of the second inverter 120 is directly coupled to the output line 101 of the pre-stage 100. Accordingly, the second inverter 120 receives, through the input terminal, the pre-voltage signal V_REF applied to the output line 101 of the pre-stage 100. The output terminal of the second inverter 120 is coupled to a gate terminal of the first NMOS transistor MN01. Accordingly, the second inverter 120 outputs a signal obtained by inverting the logic level of the pre-voltage signal V_PRE through the output terminal and transmits the signal to the gate terminal of the first NMOS transistor MN01.

The first PMOS transistor MP01 and the second PMOS transistor MP02 of the pre-stage 100 are disposed in parallel between the pull-up terminal of the first inverter 110 and the supply voltage VDD. The first PMOS transistor MP01 receives the clock signal CK through a gate terminal. A source terminal of the first PMOS transistor MP01 is coupled to the supply voltage VDD. A drain terminal of the first PMOS transistor MP01 is coupled to the pull-up terminal of the first inverter 110. A gate terminal of the second PMOS transistor MP02 is coupled to an output line 410 of the first shift-stage 200(1). Accordingly, the second PMOS transistor MP02 receives, through the gate terminal, the inverted signal QB[0], which is applied to the output line 410 of the first shift-stage 200(1). A source terminal of the second PMOS transistor MP02 is coupled to the supply voltage VDD. A drain terminal of the second PMOS transistor MP02 is coupled to the pull-up terminal of the first inverter 110.

The first NMOS transistor MN01 and the second NMOS transistor MN02 of the pre-stage 100 are disposed in series between the output line 101 of the pre-stage 100 and the ground voltage VSS. The first NMOS transistor MN01 receives an output signal of the second inverter 120 of the pre-stage 100 through the gate terminal. A drain terminal of the first NMOS transistor MN01 is coupled to the output line 101 of the pre-stage 100. A source terminal of the first NMOS transistor MN01 is coupled to a drain terminal of the second NMOS transistor MN02. The second NMOS transistor MN02 receives the clock signal CK through a gate terminal. A source terminal of the second NMOS transistor MN02 is coupled to the ground voltage VSS.

A first shift-stage 200(1), which is the first of odd-numbered shift-stages 200(1), 200(3), . . . , receives the clock signal CK and a second shift output signal Q[1] output from the second shift-stage 200(2). The first shift-stage 200(1) outputs the inverted signal QB[0] applied to the output line 410. In an embodiment, the first shift-stage 200(1) includes a first inverter 211, a second inverter 212, a first NMOS transistor MN11, a second NMOS transistor MN12, a first PMOS transistor MP11, and a second PMOS transistor MP12. The first inverter 211 included in the first shift-stage 200(1) has an input terminal, a pull-up terminal, a pull-down terminal, and an output terminal. The input terminal of the first inverter 211 is coupled to the output line 101 of the pre-stage 100. Accordingly, the first inverter 211 receives, through the input terminal, the pre-voltage signal V_PRE applied to the output line 101 of the pre-stage 100. The pull-up terminal of the first inverter 211 is directly coupled to the supply voltage VDD. The pull-down terminal of the first inverter 211 is coupled to the ground voltage VSS through the first NMOS transistor MN11 or the second NMOS transistor MN12. The output terminal of the first inverter 211 outputs, through the output terminal, a signal applied to the pull-up terminal or a signal applied to the pull-down terminal as the inverted signal. As described with reference to FIG. 1, the inverted signal QB[0] applied to the output line 410 of the first shift-stage 200(1) is input to the second shift-stage 200(2) and the output inverter 310 of FIG. 1. The output inverter 310 of FIG. 1 inverts a binary value of the inverted signal QB[0], and then outputs the inverted signal as the first shift output signal Q[0] through the first shift output line 510 of FIG. 1 of the shift register 10.

The second inverter 212 included in the first shift-stage 200(1) has an input terminal and an output terminal. Although not shown in FIG. 2, the second inverter 212 has a pull-up terminal and a pull-down terminal coupled to the supply voltage VDD and the ground voltage VSS, respectively. The input terminal of the second inverter 212 is directly coupled to the output line 410 of the first shift-stage 200(1). Accordingly, the second inverter 212 receives, through the input terminal, the inverted signal QB[0] applied to the output line of the first shift-stage 200(1). The output terminal of the second inverter 212 is coupled to a gate terminal of the first PMOS transistor MP11. Accordingly, the second inverter 212 outputs, through the output terminal, the signal obtained by inverting the logic level of the inverted signal QB[0] and transmits the signal to the gate terminal of the first PMOS transistor MP11.

The first NMOS transistor MN11 and the second NMOS transistor MN12 of the first shift-stage 200(1) are disposed in parallel between the pull-down terminal of the first inverter 211 and the ground voltage VSS. The first NMOS transistor MN11 receives the clock signal CK through a gate terminal. A source terminal of the first NMOS transistor MN11 is coupled to the ground voltage VSS. A drain terminal of the first NMOS transistor MN11 is coupled to the pull-down terminal of the first inverter 211. A gate terminal of the second NMOS transistor MN12 is coupled to the output line 420 of the second shift-stage 200(2). Accordingly, the second NMOS transistor MN12 receives, through the gate terminal, the first shift output signal Q[1] applied to the output line 420 of the second shift-stage 200(2). A source terminal of the second NMOS transistor MN12 is coupled to the ground voltage VSS. A drain terminal of the second NMOS transistor MN12 is coupled to the pull-down terminal of the first inverter 211.

The first PMOS transistor MP11 and the second PMOS transistor MP12 of the first shift-stage 200(1) are disposed in series between the output line 410 of the first shift-stage 200(1) and the supply voltage VDD. The first PMOS transistor MP11 receives an output signal of the second inverter 212 through the gate terminal. A drain terminal of the first PMOS transistor MP11 is coupled to the output line 410 of the first shift-stage 200(1). A source terminal of the first PMOS transistor MP11 is coupled to a drain terminal of the second PMOS transistor MP12. The second PMOS transistor MP12 receives the clock signal CK through a gate terminal. A source terminal of the second PMOS transistor MP12 is coupled to the supply voltage VDD.

A second shift-stage 200(2), which is the first of even-numbered shift-stages 200(2), 200(4), . . . , has the same circuit structure as the pre-stage 100, as described with reference to FIG. 1. Specifically, the second shift-stage 200(2) receives the clock signal CK and an inverted signal QB[2] output from the third shift-stage 200(3). The second shift-stage 200(2) outputs a second shift output signal Q[1] applied to an output line 420. In an embodiment, the second shift-stage 200(2) includes a first inverter 221, a second inverter 222, a first PMOS transistor MP21, a second PMOS transistor MP22, a first NMOS transistor MN21, and a second NMOS transistor MN22. The first inverter 221 included in the second shift-stage 200(2) has an input terminal, a pull-up terminal, a pull-down terminal, and an output terminal. The input terminal of the first inverter 221 is coupled to the output line 410 of the first shift-stage 200(1). Accordingly, the first inverter 221 receives, through the input terminal, the inverted signal QB[0] applied to the output line 410 of the first shift-stage 200(1). The pull-up terminal of the first inverter 221 is coupled to the supply voltage VDD through the first PMOS transistor MP21 or the second PMOS transistor MP22. The pull-down terminal of the first inverter 221 is directly coupled to the ground voltage VSS. The output terminal of the first inverter 221 is directly coupled to the output line 420 of the second shift-stage 200(2). The first inverter 221 outputs, through the output terminal, the signal applied to the pull-up terminal or the signal applied to the pull-down terminal as the inverted signal. As described with reference to FIG. 1, the second shift output signal Q[1] applied to the output line 420 of the second shift-stage 200(2) is transmitted to the third shift-stage 200(3) and is also output from the shift register 10 through the second shift output line 520 of FIG. 1.

The second inverter 222 included in the second shift-stage 200(2) has an input terminal and an output terminal. Although omitted from FIG. 2, the second inverter 222 includes a pull-up terminal and a pull-down terminal coupled to the supply voltage VDD and the ground voltage VSS, respectively. The input terminal of the second inverter 222 is directly coupled to an output line 420 of the second shift-stage 200(2). Accordingly, the second inverter 222 receives, through the input terminal, the second shift output signal Q[1] that is applied to the output line 420 of the second shift-stage 200(2). The output terminal of the second inverter 222 is coupled to a gate terminal of the first NMOS transistor MN21. Accordingly, the second inverter 222 outputs, through the output terminal, a signal obtained by inverting the logic level of the second shift output signal Q[1] and transmits the signal to the gate terminal of the first NMOS transistor MN21.

The first PMOS transistor MP21 and the second PMOS transistor MP22 of the second shift-stage 200(2) are disposed in parallel between the pull-up terminal of the first inverter 221 and the supply voltage VDD. The first PMOS transistor MP21 receives the clock signal CK through a gate terminal. A source terminal of the first PMOS transistor MP21 is coupled to the supply voltage VDD. A drain terminal of the first PMOS transistor MP21 is coupled to the pull-up terminal of the first inverter 221. A gate terminal of the second PMOS transistor MP22 is coupled to an output line 430 of the third shift-stage 200(3). Accordingly, the second PMOS transistor MP22 receives, through the gate terminal, the inverted signal QB[2] applied to the output line 430 of the third shift-stage 200(3). A source terminal of the second PMOS transistor MP22 is coupled to the supply voltage VDD. A drain terminal of the second PMOS transistor MP22 is coupled to the pull-up terminal of the first inverter 221.

The first NMOS transistor MN21 and the second NMOS transistor MN22 of the second shift-stage 200(2) are disposed in series between the output line 420 of the second shift-stage 200(2) and the ground voltage VSS. The first NMOS transistor MN21 receives an output signal of the second inverter 222 through the gate terminal. A drain terminal of the first NMOS transistor MN21 is coupled to the output line 420 of the second shift-stage 200(2). A source terminal of the first NMOS transistor MN21 is coupled to a drain terminal of the second NMOS transistor MN22. The second NMOS transistor MN22 receives the clock signal CK through a gate terminal. A source terminal of the second NMOS transistor MN22 is coupled to the ground voltage VSS.

A third shift-stage 200(3), which is the second of the odd-numbered shift-stages 200(1), 200(3), . . . , has the same circuit structure as the first shift-stage 200(1). Specifically, the third shift-stage 200(3) receives the clock signal CK and a fourth shift output signal Q[3] output from the fourth shift-stage. The third shift-stage 200(3) outputs an inverted signal QB[2] applied to the output line 430. In an embodiment, the third shift-stage 200(3) includes a first inverter 231, a second inverter 232, a first NMOS transistor MN31, a second NMOS transistor MN32, a first PMOS transistor MP31, and a second PMOS transistor MP32. The first inverter 231 included in the third shift-stage 200(3) has an input terminal, a pull-up terminal, a pull-down terminal, and an output terminal. The input terminal of the first inverter 231 is coupled to the output line 420 of the second shift-stage 200(2). Accordingly, the first inverter 231 receives, through the input terminal, the second shift output signal Q[1] output from the second shift-stage 200(2). The pull-up terminal of the first inverter 231 is directly coupled to the supply voltage VDD. The pull-down terminal of the first inverter 231 is coupled to the ground voltage VSS through the first NMOS transistor MN31 or the second NMOS transistor MN32. The output terminal of the first inverter 231 is directly coupled to the output line 430 of the third shift-stage 200(3). The first inverter 231 outputs, through the output terminal, the signal applied to the pull-up terminal or the signal applied the pull-down terminal as an inverted signal. As described with reference to FIG. 1, the inverted signal QB[2] applied to the output line 430 of the third shift-stage 200(3) is input to the fourth shift-stage and the output inverter 320 of FIG. 1. The output inverter 320 of FIG. 1 inverts the binary value of the inverted signal QB[2] and then outputs the inverted signal as the third shift output signal Q[2] in FIG. 1 through the third shift output line 530 in FIG. 1 of the shift register 10.

The second inverter 232 included in the third shift-stage 200(3) has an input terminal and an output terminal. Although not shown in FIG. 2, the second inverter 232 has a pull-up terminal and a pull-down terminal coupled to the supply voltage VDD and the ground voltage VSS, respectively. The input terminal of the second inverter 232 is directly coupled to the output line 430 of the third shift-stage 200(3). Accordingly, the second inverter 232 receives, through the input terminal, the inverted signal QB[2] applied to the output line 430 of the third shift-stage 200(3). The output terminal of the second inverter 232 is coupled to a gate terminal of the first PMOS transistor MP31. Accordingly, the second inverter 232 outputs, through the output terminal, a signal obtained by inverting the logic level of the inverted signal QB[2] and transmits the signal to the gate terminal of the first PMOS transistor MP31.

The first NMOS transistor MN31 and the second NMOS transistor MN32 of the third shift-stage 200(3) are disposed in parallel between the pull-down terminal of the first inverter 231 and the ground voltage VSS. The first NMOS transistor MN31 receives the clock signal CK through a gate terminal. A source terminal of the first NMOS transistor MN31 is coupled to the ground voltage VSS. A drain terminal of the first NMOS transistor MN31 is coupled to the pull-down terminal of the first inverter 231. Although not shown in FIG. 2, a gate terminal of the second NMOS transistor MN32 is coupled to the output line of the fourth shift-stage. Accordingly, the second NMOS transistor MN32 receives, through the gate terminal, a fourth shift output signal Q[3] applied to the output line of the fourth shift-stage. A source terminal of the second NMOS transistor MN32 is coupled to the ground voltage VSS. A drain terminal of the second NMOS transistor MN32 is coupled to the pull-down terminal of the first inverter 231.

The first PMOS transistor MP31 and the second PMOS transistor MP32 of the third shift-stage 200(3) are disposed in series between the output line 430 of the third shift-stage 200(3) and the supply voltage VDD. The first PMOS transistor MP31 receives an output signal of the second inverter 232 through a gate terminal. A drain terminal of the first PMOS transistor MP31 is coupled to the output line 430 of the third shift-stage 200(3). A source terminal of the first PMOS transistor MP31 is coupled to a drain terminal of the second PMOS transistor MP32. The second PMOS transistor MP32 receives the clock signal CK through a gate terminal. A source terminal of the second PMOS transistor is coupled to the supply voltage VDD.

FIG. 3 is a timing diagram during a shifting operation of a shift register according to an embodiment of the present disclosure, for example, as shown in FIG. 2. In FIG. 3, the same reference numerals used in FIG. 2 represent the same components.

Referring to FIG. 3 together with FIG. 2, a shift register 10 performs an edge-based shifting operation in which shifting is performed whenever edges (that is, a rising edge and a falling edge) of a clock signal CK are generated while the logic level of a pre-voltage signal V_PRE output from a pre-stage 100 is at a high level. Specifically, at first time T11 after time T01, at which the logic level of a reset signal RST transitions from a high level to a low level, a first edge at which the logic level of a clock signal CK transitions from a high level to a low level occurs. At the first time T11, the logic level of the pre-voltage signal V_PRE output from the pre-stage 100 transitions from a low level to a high level. After the first time T11, the logic level of the pre-voltage signal V_PRE output from the pre-stage 100 is maintained at a high level. After the first time T11, shift output signals Q[0], Q[1], Q[2], Q[3], . . . whose logic levels sequentially transition to a high level whenever the edge of the clock signal CK occurs are output from the shift register 10.

After the first time T11, while the logic level of the pre-voltage signal V_PRE is at a high level, a first edge at which the logic level of the clock signal CK transitions from a low level to a high level occurs at second time T12. At the second time T12, the logic level of an inverted signal QB[0] output from a first shift-stage 200(1) transitions from a high level to a low level. Accordingly, the logic level of the first shift output signal Q[0] output from the shift register 10 transitions from a low level to a high level. After the second time T12, the logic level of the inverted signal QB[0] output from the first shift-stage 200(1) is maintained at a low level, and the logic level of the first shift output signal Q[0] output from the shift register 10 is maintained at a high level.

After the first time T11, while the logic level of the pre-voltage signal V_PRE is at a high level, at third time T13, a second edge occurs where the logic level of the clock signal CK transitions from a high level to a low level. At the third time T13, the logic level of the second shift output signal Q[1] output from a second shift-stage 200(2) transitions from a low level to a high level. After the third time T13, the logic level of the second shift output signal Q[1] output from the second shift-stage 200(2), that is, output from the shift register 10, is maintained at a high level.

After the first time T11, while the logic level of the pre-voltage signal V_PRE is at a high level, at fourth time T14, a third edge occurs where the logic level of the clock signal CK transitions from a low level to a high level. At the fourth time T14, the logic level of an inverted signal QB[2] output from the third shift-stage 200(3) transitions from a high level to a low level. Accordingly, the logic level of the third shift output signal Q[2] output from the shift register 10 transitions from a low level to a high level. After the fourth time T14, the logic level of the inverted signal QB[2] output from the third shift-stage 200(3) is maintained at a low level, and accordingly, the logic level of the third shift output signal Q[2] output from the shift register 10 is maintained at a high level.

After the first time T11, while the logic level of the pre-voltage signal V_PRE is at a high level, at fifth time T15, a fourth edge occurs where the logic level of the clock signal CK transitions from a high level to a low level. At the fifth time T15, the logic level of the fourth shift output signal Q[3] output from the fourth shift-stage transitions from a low level to a high level. After the fifth time T15, the logic level of the fourth shift output signal Q[3] output from the fourth shift-stage, that is, output from the shift register 10, is maintained at a high level.

Figure 4:
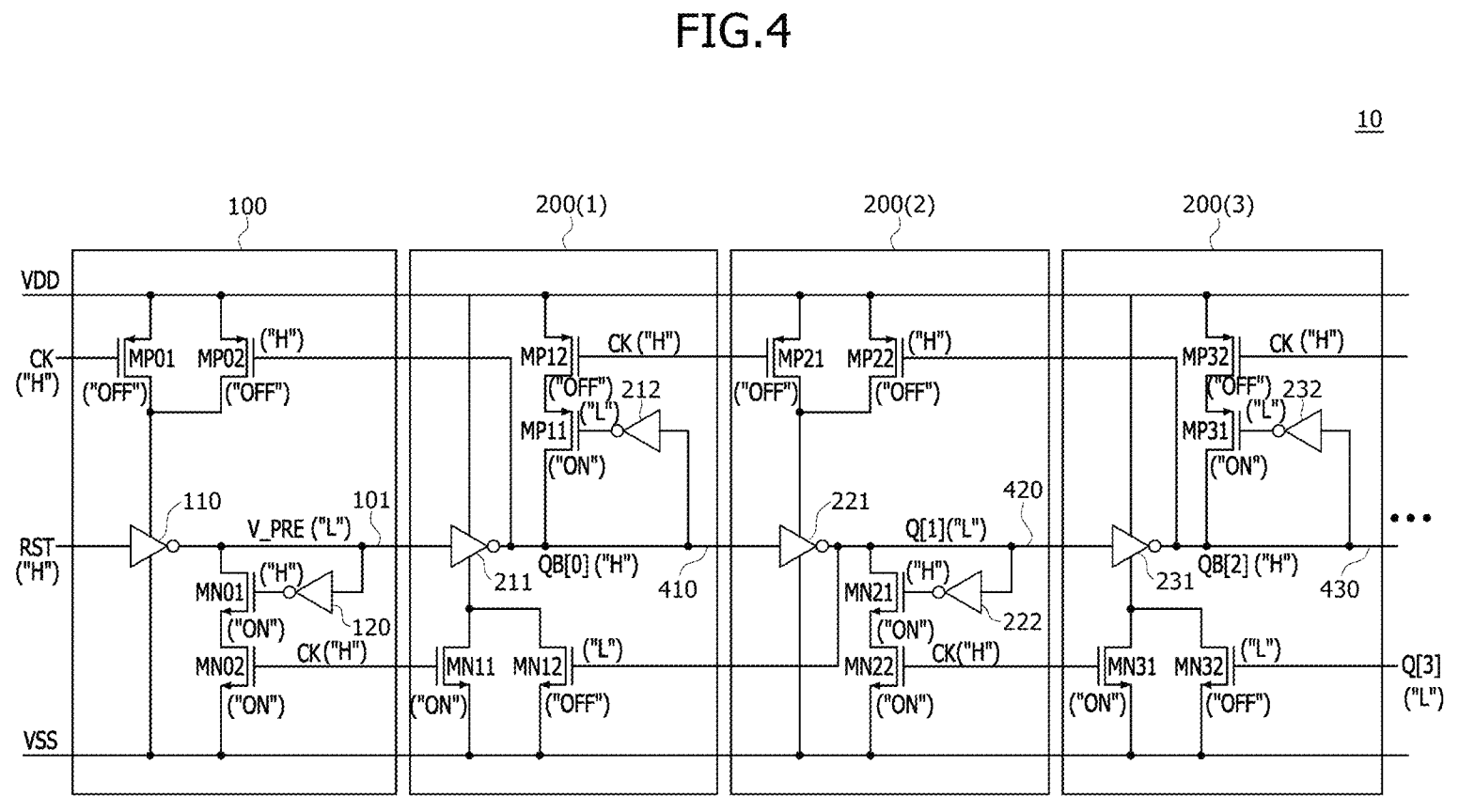

FIG. 4 is a circuit diagram illustrating an operation of a shift register according to an embodiment of the present disclosure, for example, as shown in FIG. 2. Specifically, FIG. 4 is a circuit diagram illustrating the operation of a shift register at a time when logic levels of a reset signal and a clock signal are both at a high level in the timing diagram of FIG. 3.

Referring to FIG. 4 together with FIG. 2 and FIG. 3, while the logic level of the reset signal RST is at a high level "H" and the logic level of the clock signal CK is also at a high level "H", that is, between the time "T10" and the time "T01" of FIG. 3, all of the PMOS transistors of the pre-stage 100 that receive the clock signal CK of a high level "H" through gate terminals, and PMOS transistors of the first to third shift-stages 200(1), 200(2), 200(3), are all turned off. Specifically, the first PMOS transistor MP01 of the pre-stage 100, the second PMOS transistor MP12 of the first shift-stage 200(1), the first PMOS transistor MP21 of the second shift-stage 200(2), and the second PMOS transistor MP32 of the third shift-stage 200(3) are turned off. On the other hand, all of NMOS transistors of the pre-stage 100 that receive the clock signal CK of a high level "H" through gate terminals and the NMOS transistors of the first to third shift-stages 200(1), 200(2), 200(3) are turned on. Specifically, the second NMOS transistor MN02 of the pre-stage 100, the first NMOS transistor MN11 of the first shift-stage 200(1), the second NMOS transistor MN22 of the second shift-stage 200(2), and the first NMOS transistor MN31 of the third shift-stage 200(3) are turned on.

The first inverter 110 of the pre-stage 100 receives the reset signal RST of a high level "H" through the input terminal. As the pull-down terminal of the first inverter 110 is directly coupled to the ground voltage VSS, the first inverter 110 outputs an inverted signal of a low level "L". Accordingly, the logic level of the pre-voltage signal V_PRE applied to the output line 101 of the pre-stage 100 has a low level "L". The pre-voltage signal V_PRE of a low level "L" applied to the output line 101 of the pre-stage 100 is transmitted to the input terminal of the first inverter 211 of the first shift-stage 200(1). The pull-up terminal of the first inverter 211 of the first shift-stage 200(1) is directly coupled to the supply voltage VDD. Accordingly, the first inverter 211 of the first shift-stage 200(1) outputs a first shifted signal of a high level "H". Accordingly, the logic level of the inverted signal QB[0] applied to the output line 410 of the first shift-stage 200(1) becomes a high level "H", and the logic level of the first shift output signal Q[0] output from the shift register 10 becomes a low level "L".

The second PMOS transistor MP02 of the pre-stage 100, which receives, through the gate terminal, the inverted signal QB[0] of a high level "H" applied to the output line 410 of the first shift-stage 200(1), is turned off. Accordingly, the pull-up terminal of the first inverter 110 of the pre-stage 100 is floated. The second inverter 120 of the pre-stage 100, which receives the pre-voltage signal V_PRE of a low level "L" applied to the output line 101 of the pre-stage 100, outputs a signal of a high level "H". The first NMOS transistor MN01 of the pre-stage 100, which receives the signal of a high level "H" output from the second inverter 120 through the gate terminal, is turned on. As both the first NMOS transistor MN01 and the second NMOS transistor MN02 of the pre-stage 100 are turned on, the output line 101 of the pre-stage 100 is coupled to the ground voltage VSS. Therefore, the logic level of the pre-voltage signal V_PRE applied to the output line 101 of the pre-stage 100 is maintained at a low level "L".

The inverted signal QB[0] of a high level "H" output from the first shift-stage 200(1) is transmitted to the input terminal of the first inverter 221 of the second shift-stage 200(2). Because the pull-down terminal of the first inverter 221 of the second shift-stage 200(2) is directly coupled to the ground voltage VSS, the first inverter 221 of the second shift-stage 200(2) outputs a first shifted signal of a low level "L". Therefore, the logic level of the second shift output signal Q[1] applied to the output line 420 of the second shift-stage 200(2) becomes a low level "L", and the logic level of the second shift output signal Q[1] output from the shift register 10 becomes a low level "L".

The second NMOS transistor MN12 of the first shift-stage 200(1), which receives, through the gate terminal, the second shift output signal Q[1] of a low level "L" applied to the output line 420 of the second shift-stage 200(2), is turned off. The second inverter 212 of the first shift-stage 200(1), which receives the inverted signal QB[0] of a high level "H" applied to the output line 410 of the first shift-stage 200(1), outputs a signal of a low level "L". The first PMOS transistor MP11 of the first shift-stage 200(1), which receives, through the gate terminal, a signal of a low level "L" output from the second inverter 212, is turned on. The first PMOS transistor MP11 is turned on, but the second PMOS transistor MP12 is turned off. Accordingly, the connection between the output line 410 of the first shift-stage 200(1) and the supply voltage VDD is opened.

The second shift output signal Q[1] of a low level "L" output from the second shift-stage 200(2) is transmitted to the input terminal of the first inverter 231 of the third shift-stage 200(3). Because the pull-up terminal of the first inverter 231 of the third shift-stage 200(3) is directly coupled to the supply voltage VDD, the first inverter 231 of the third shift-stage 200(3) outputs an inverted signal of a high level "H". Accordingly, the logic level of the inverted signal QB[2] applied to the output line 430 of the third shift-stage 200(3) becomes a high level "H", and the logic level of the third shift output signal Q[2] output from the shift register 10 becomes a low level "L".

The second PMOS transistor MP22 of the second shift-stage 200(2), which receives, through the gate terminal, the inverted signal QB[2] of a high level "H" applied to the output line 430 of the third shift-stage 200(3), is turned off. The second inverter 222 of the second shift-stage 200(2), which receives the second shift output signal Q[1] of a low level "L" applied to the output line 420 of the second shift-stage 200(2) outputs a signal of a high level "H". The first NMOS transistor MN21 of the second shift-stage 200(2), which receives, through the gate terminal, the signal of a high level "H" output from the second inverter 222, is turned on. As both the first NMOS transistor MN21 and the second NMOS transistor MN22 of the second shift-stage 200(2) are turned on, the output line 420 of the second shift-stage 200(2) is directly coupled to the ground voltage VSS. Accordingly, the logic level of the second shift output signal Q[1] applied to the output line 420 of the second shift-stage 200(2) is maintained at a low level "L".

Although not shown in FIG. 4, the inverted signal QB[2] of a high level "H" output from the third shift-stage 200(3) is transmitted to the input terminal of a first inverter of a fourth shift-stage. Because a circuit configuration of the fourth shift-stage is the same as that of each of the pre-stage 100 and the second shift-stage 200(2), a fourth shift output signal Q[3] of a low level "L" is applied to an output line of the fourth shift-stage, and accordingly, the fourth shift output signal Q[3] output from the shift register 10 is at a low level "L".

The second NMOS transistor MN32 of the third shift-stage 200(3), which receives, through the gate terminal, the fourth shift output signal Q[3] of a low level "L" applied to the output line of the fourth shift-stage, is turned off. The second inverter 232 of the third shift-stage 200(3), which receives the inverted signal QB[2] of a high level "H" applied to the output line 430 of the third shift-stage 200(3), outputs a signal of a low level "L". The first PMOS transistor MP31 of the third shift-stage 200(3), which receives, through the gate terminal, the signal of a low level "L" output from the second inverter 232, is turned on. The first PMOS transistor MP31 is turned on, but the second PMOS transistor MP32 is turned off. Accordingly, the connection between the output line 430 of the third shift-stage 200(3) and the supply voltage VDD is opened.

Figure 5:
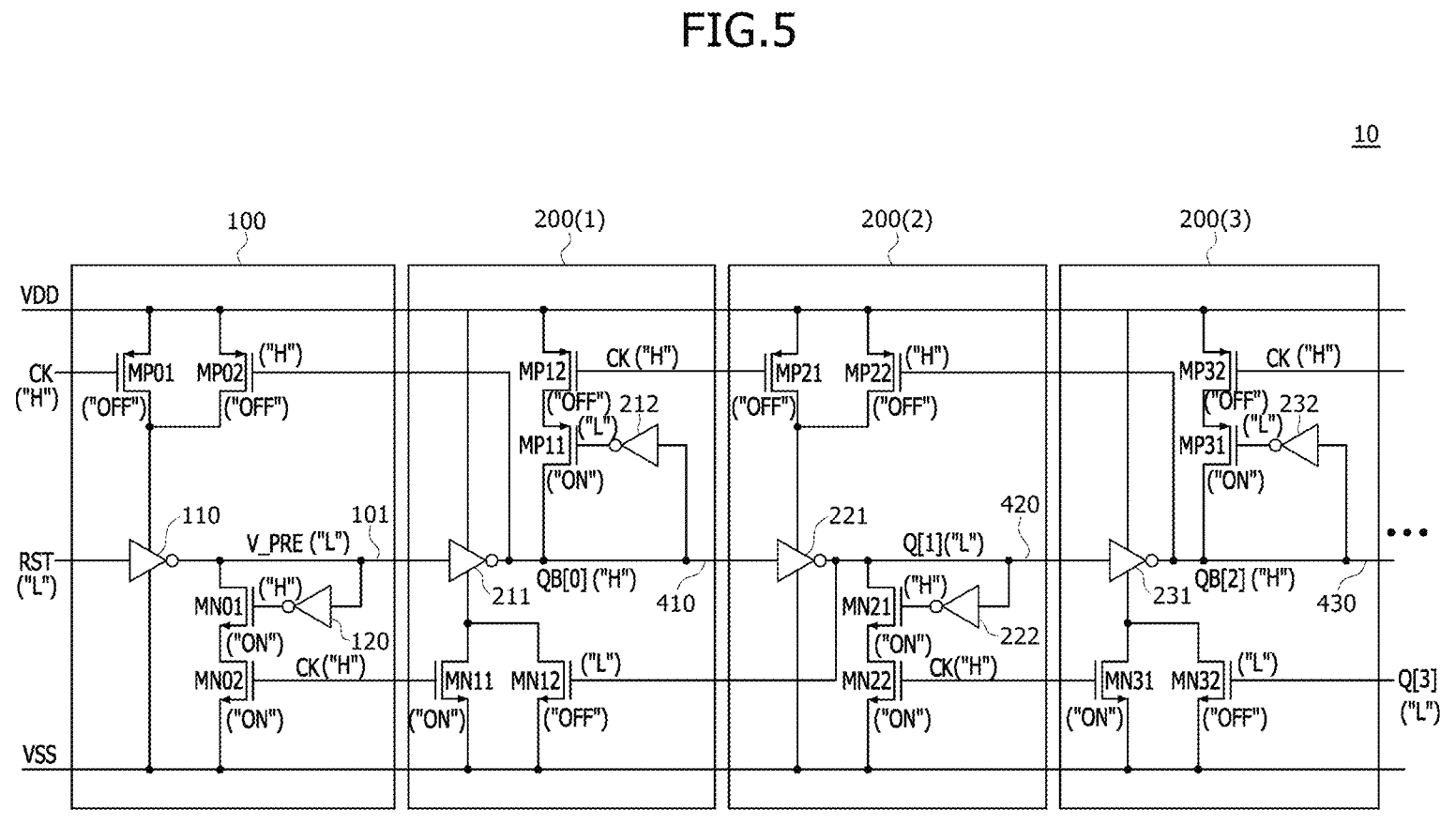

FIG. 5 is a circuit diagram illustrating an operation of a shift register according to an embodiment of the present disclosure, for example, as shown in FIG. 2. Specifically, FIG. 5 is a circuit diagram illustrating the operation of a shift register at time T01 when a logic level of a reset signal transitions from a high level to a low level and a logic level of a clock signal is at a high level in the timing diagram of FIG. 3.

Referring to FIG. 5 together with FIG. 2 and FIG. 3, at the time T01 when the logic level of the reset signal RST transitions from a high level "H" to a low level "L" and while the logic level of the clock signal CK is at a high level "H", all of the first PMOS transistor MP01 of the pre-stage 100, the second PMOS transistor MP12 of the first shift-stage 200(1), the first PMOS transistor MP21 of the second shift-stage 200(2), and the second PMOS transistor MP32 of the third shift-stage 200(3) are maintained in a turned-off state. In addition, all of the second NMOS transistor MN02 of the pre-stage 100, the first NMOS transistor MN11 of the first shift-stage 200(1), the second NMOS transistor MN22 of the second shift-stage 200(2), and the first NMOS transistor MN31 of the third shift-stage 200(3) are maintained in a turned-on state.

The first inverter 110 of the pre-stage 100 receives the reset signal RST of a low level "L" through the input terminal. Accordingly, the first inverter 110 of the pre-stage 100 outputs the voltage applied to the pull-up terminal as an inverted signal through the output terminal. Because the first PMOS transistor MP01 of the pre-stage 100 is turned off and the second PMOS transistor MP02 of the pre-stage 100 to which the inverted signal QB[0] of a high level "H" is applied to the gate terminal is also turned off, the connection between the pull-up terminal of the first inverter 110 of the pre-stage 100 and the supply voltage VDD is opened. Therefore, the output terminal of the first inverter 110 of the pre-stage 100 is floated. However, because both the first NMOS transistor MN01 and the second NMOS transistor MN02 of the pre-stage 100 are turned on, the pre-voltage signal V_PRE applied to the output line 101 of the pre-stage 100 is maintained at a logic level of a low level "L". That is, the first NMOS transistor MN01 and the second NMOS transistor MN02 of the pre-stage 100 prevent the output line 101 of the pre-stage 100 from being floated when the reset signal RST is at a low level and the pull-up terminal of the first inverter 110 is in a floating state.

As the logic level of the pre-voltage signal V_PRE output from the pre-stage 100 remains at a low level "L", the first shift-stage 200(1) and the third shift-stage 200(3), which are odd-numbered shift-stages, and the second shift-stage 200(2), which is an even-numbered shift-stage, all maintain the same circuit state as the circuit state described with reference to FIG. 4. That is, as the first shift-stage 200(1) and the third shift-stage 200(3) included in the odd-numbered shift-stages output the inverted signals QB[0] and QB[2] of a high level "H", respectively, the shift register 10 outputs the first shift output signal Q[0] and the third shift output signal Q[2] of a low level "L". In addition, as the second shift-stage 200(2) included in the even-numbered shift-stages outputs the second shift output signal Q[1] of a low level "L", the shift register 10 outputs the second shift output signal Q[1] of a low level "L".

Figure 6:
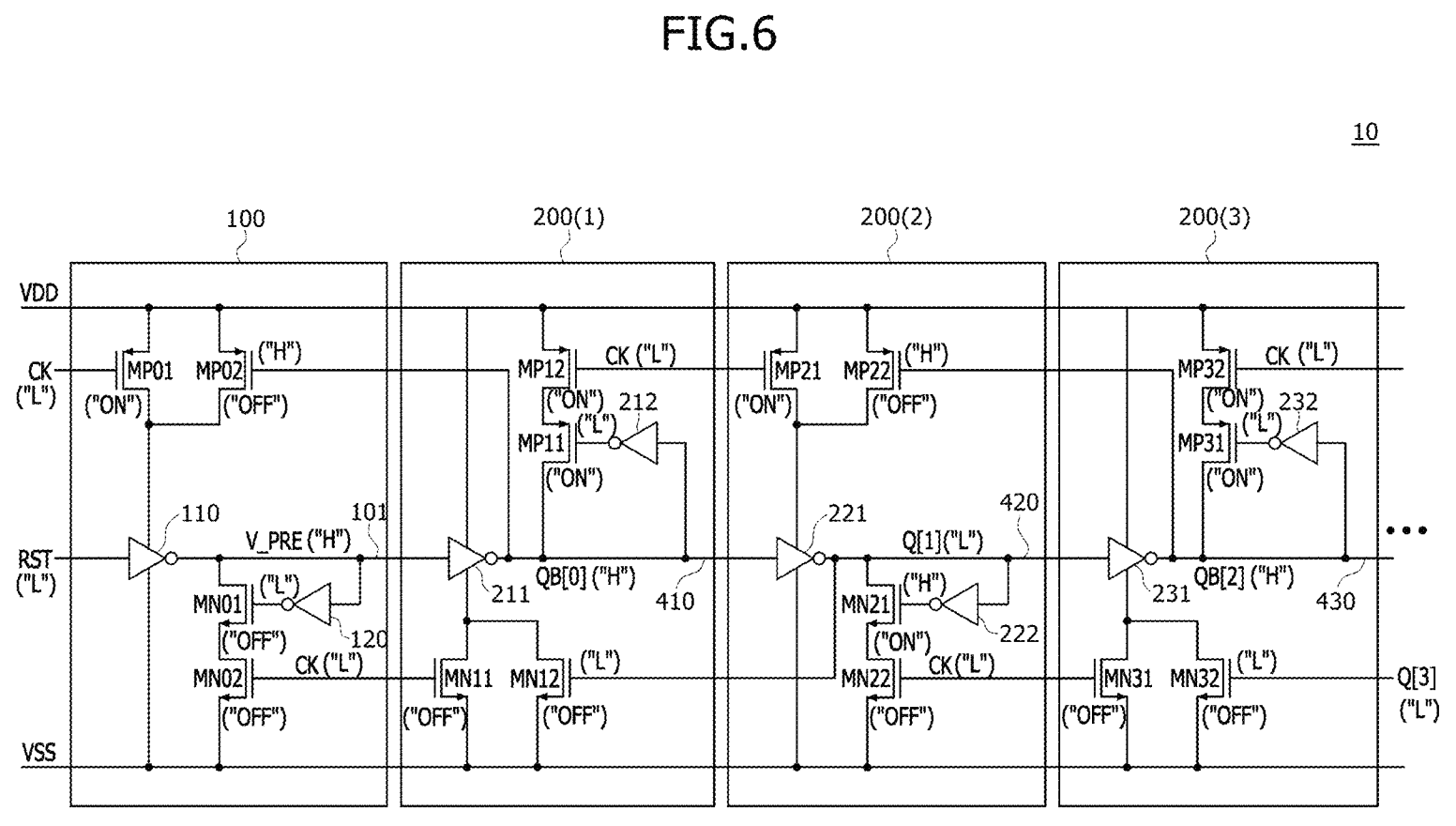

FIG. 6 is a circuit diagram illustrating an operation of a shift register according to an embodiment of the present disclosure, for example, as shown in FIG. 2. Specifically, FIG. 6 is a circuit diagram illustrating the operation of a shift register at first time T11 when a logic level of a clock signal transitions from a high level to a low level after a logic level of a reset signal transitions from a high level to a low level in the timing diagram of FIG. 3.

Referring to FIG. 6 together with FIG. 2 and FIG. 3, at the first time T11 when the logic level of the clock signal CK transitions from a high level "H" to a low level "L" while the logic level of the reset signal RST is at a low level "L", all PMOS transistors of the pre-stage 100 and the first to third shift-stages 200(1), 200(2), 200(3) that receive the clock signal CK at a low level "L" through the gate terminals are turned on. Specifically, the states of the first PMOS transistor MP01 of the pre-stage 100, the second PMOS transistor MP12 of the first shift-stage 200(1), the first PMOS transistor MP21 of the second shift-stage 200(2), and the second PMOS transistor MP32 of the third shift-stage 200(3) are changed from a turn-off state to a turn-on state. On the other hand, all NMOS transistors of the pre-stage 100 and the first to third shift-stages 200(1), 200(2), 200(3) that receive the clock signal CK of a low level "L" through the gate terminals are turned off. Specifically, the states of the second NMOS transistor MN02 of the pre-stage 100, the first NMOS transistor MN11 of the first shift-stage 200(1), the second NMOS transistor MN22 of the second shift-stage 200(2), and the first NMOS transistor MN31 of the third shift-stage 200(3) are changed from a turn-on state to a turn-off state.

The first inverter 110 of the pre-stage 100 receives the reset signal RST of a low level "L" through the input terminal. As the pull-up terminal of the first inverter 110 is coupled to the supply voltage VDD through the first PMOS transistor MP01 in a turned-on state, the first inverter 110 outputs an inverted signal of a high level "H". That is, the logic level of the pre-voltage signal V_PRE applied to the output line 101 of the pre-stage 100 becomes a high level "H". The pre-voltage signal V_PRE of a high level "H" applied to the output line 101 of the pre-stage 100 is transmitted to the input terminal of the first inverter 211 of the first shift-stage 200(1). Because both the first NMOS transistor MN11 and the second NMOS transistor MN12 of the first shift-stage 200(1) are turned off, the pull-down terminal of the first inverter 211 becomes floated. Accordingly, the output terminal of the first inverter 211 that receives the pre-voltage signal V_PRE of a high level "H" also becomes floated.

As the second PMOS transistor MP12 of the first shift-stage 200(1) switches to a turn-on state from a turn-off state, the supply voltage VDD is applied to the output line 410 of the first shift-stage 200(1) through the first PMOS transistor MP11 and the second PMOS transistor MP12, which is also in a turn-on state. Therefore, even if the output terminal of the first inverter 211 of the first shift-stage 200(1) is floating, the inverted signal QB[0] applied to the output line 410 of the first shift-stage 200(1) maintains a logic level of high level "H". As the inverted signal QB[0] of a high level "H" is applied to the output line 410 of the first shift-stage 200(1), the first shift output signal Q[0] output from the shift register 10 is maintained at a logic level of a low level "L".

As the first PMOS transistor MP21 of the second shift-stage 200(2) is turned on, the supply voltage VDD is applied to the pull-up terminal of the first inverter 221 of the second shift-stage 200(2). The ground voltage VSS is applied to the pull-down terminal of the first inverter 221 of the second shift-stage 200(2). Because the inverted signal QB[0] of a high level "H" is applied to the input terminal of the first inverter 221 of the second shift-stage 200(2), the logic level of the inverted signal output through the output terminal of the first inverter 221 of the second shift-stage 200(2) is maintained at a low level "L". Accordingly, the logic level of the second shift output signal Q[1] applied to the output line 420 of the second shift-stage 200(2) is also maintained at a low level "L". Additionally, the second NMOS transistor MN12 of the first shift-stage 200(1) remains in a turned-off state, and the first NMOS transistor MN21 of the second shift-stage 200(2) remains in a turned-on state.

The second shift output signal Q[1] of a low level "L" output from the second shift-stage 200(2) is input to the first inverter 231 of the third shift-stage 200(3). As the pull-up terminal of the first inverter 231 of the third shift-stage 200(3) is directly coupled to the supply voltage VDD, the first inverter 231 of the third shift-stage 200(3) outputs an inverted signal of a high level "H". Accordingly, the logic level of the inverted signal QB[2] applied to the output line 430 of the third shift-stage 200(3) is maintained at a high level "H". In addition, the logic level of the first shift output signal Q[0] output from the shift register 10 is maintained at a low level "L". As the logic level of the inverted signal QB[2] applied to the output line of the third shift-stage 200(3) is maintained at a high level "H", the second PMOS transistor MP22 of the second shift-stage 200(2) remains in a turned-off state, and the first PMOS transistor MP31 of the third shift-stage 200(3) remains in a turned-on state.

Although not shown in FIG. 6, the remaining even-numbered shift-stages operate in the same manner as the second shift-stage 200(2). Accordingly, the logic levels of the inverted signals output from the remaining even-numbered shift-stages are all maintained at a low level "L". The remaining odd-numbered shift-stages operate in the same manner as the third shift-stage 200(3). Accordingly, the logic levels of the shift output signals output from the remaining odd-numbered shift-stages are all maintained at a high level "H".

Figure 7:
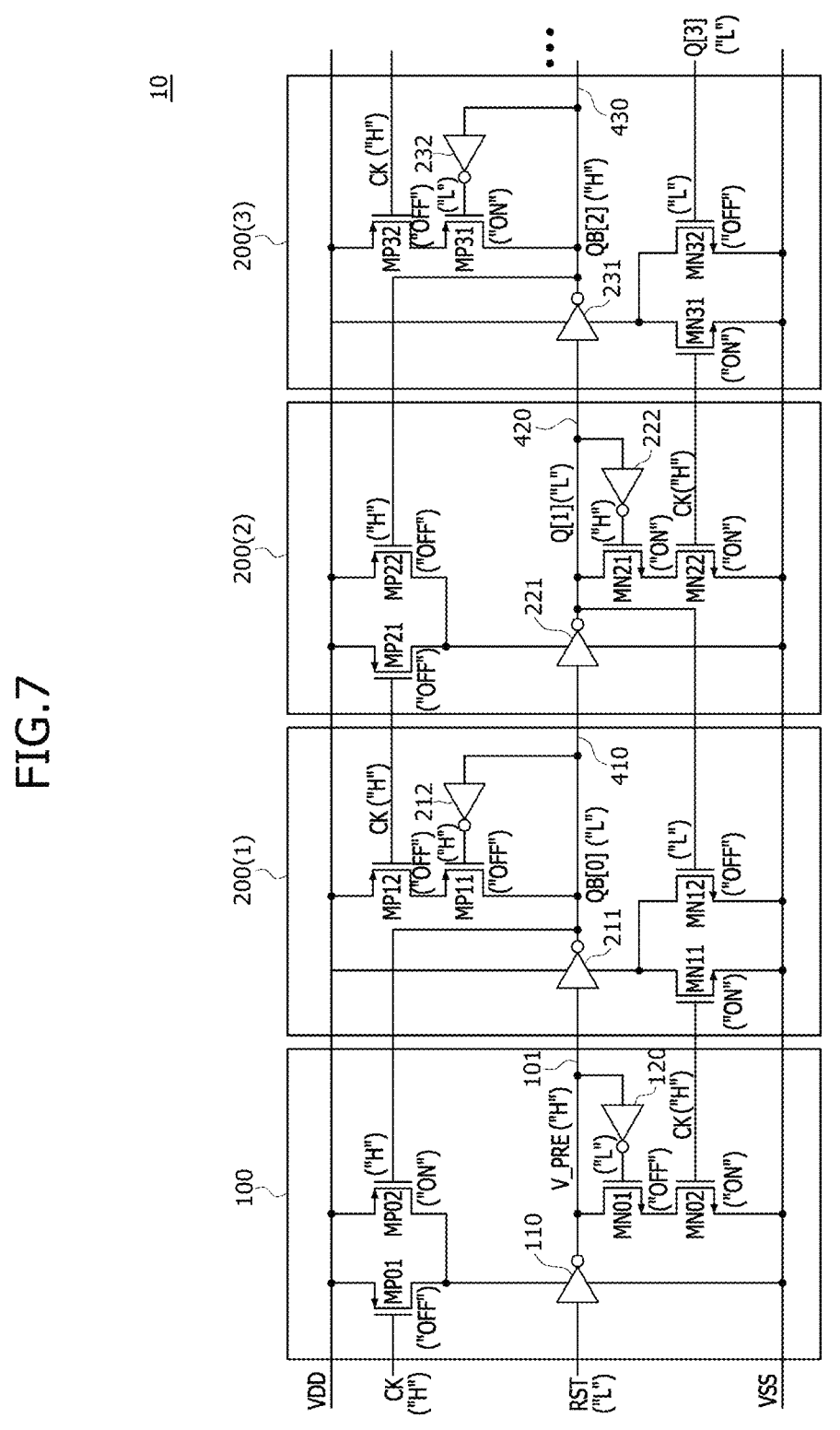

FIG. 7 is a circuit diagram illustrating an operation of a shift register according to an embodiment of the present disclosure, for example, as shown in FIG. 2. Specifically, FIG. 7 is a circuit diagram illustrating the operation of a shift register at time T12 when a first edge of the clock signal occurs, after first time T11 when a logic level of a pre-voltage signal transitions from a low level to a high level in the timing diagram of FIG. 3.

Referring to FIG. 7 together with FIG. 2 and FIG. 3, the second time T12 is the time when a first edge when the logic level of the clock signal CK transitions from a low level "L" to a high level "H", that is, a first rising edge occurs after the first time T11, when the logic level of the pre-voltage signal V_PRE transitions from a low level "L" to a high level "H". At the second time T12, the states of the first PMOS transistor MP01 of the pre-stage 100, the second PMOS transistor MP12 of the first shift-stage 200(1), the first PMOS transistor MP21 of the second shift-stage 200(2), and the second PMOS transistor MP32 of the third shift-stage 200(3) that receive the clock signal CK of a high level "H" through gate terminals are changed from a turned-on state into a turned-off state. In addition, the states of the second NMOS transistor MN02 of the pre-stage 100, the first NMOS transistor MN11 of the first shift-stage 200(1), the second NMOS transistor MN22 of the second shift-stage 200(2), and the first NMOS transistor MN31 of the third shift-stage 200(3) are changed from a turned-off state to a turned-on state.

The first inverter 211 of the first shift-stage 200(1) that receives the pre-voltage signal V_PRE of a high level "H" from the pre-stage 100 outputs a voltage applied to the pull-down terminal. As the first NMOS transistor MN11 of the first shift-stage 200(1) is turned on, the ground voltage VSS is applied to the pull-down terminal of the first inverter 211 of the first shift-stage 200(1). Accordingly, the first inverter 211 of the first shift-stage 200(1) outputs an inverted signal of a low level "L". That is, the logic level of the inverted signal QB[0] applied to the output line 410 of the first shift-stage 200(1) is changed from a high level "H" to a low level "L". In addition, the logic level of the first shift output signal Q[0] output from the shift register 10 is changed from a low level "L" to a high level "H".

The second PMOS transistor MP02 of the pre-stage 100, which receives, through the gate terminal, the inverted signal QB[0] of a low level "L" is turned on, and accordingly, the supply voltage VDD is applied to the pull-up terminal of the first inverter 110 of the pre-stage 100. Accordingly, the first inverter 110 of the pre-stage 100 which receives, through the input terminal, the reset signal RST of a low level "L" outputs the inverted signal of a high level "H" through the output terminal. Therefore, the logic level of the pre-voltage signal V_PRE applied to the output line 101 of the pre-stage 100 is maintained at a high level "H". The logic level of the output signal of the second inverter 120 of the pre-stage 100 is also maintained at a low level "L", and accordingly, the first NMOS transistor MN01 of the pre-stage 100 remains in a turned-off state.

As the logic level of the inverted signal QB[0] applied to the output line 410 of the first shift-stage 200(1) is changed from a high level "H" to a low level "L", the second inverter 212 of the first shift-stage 200(1) transmits an output signal of a high level "H" to the gate terminal of the first PMOS transistor MP11, and the first PMOS transistor MP11 is turned off. Because both the first PMOS transistor MP11 and the second PMOS transistor MP12 of the first shift-stage 200(1) are turned off, the connection between the output line 410 of the first shift-stage 200(1) and the supply voltage VDD opens.

The first inverter 221 of the second shift-stage 200(2) receives the inverted signal QB[0] of a low level "L" through the input terminal. Accordingly, the first inverter 221 of the second shift-stage 200(2) outputs, through the output terminal, a voltage applied to the pull-up terminal. Because the first PMOS transistor MP21 of the second shift-stage 200(2) is turned off and the second PMOS transistor MP22 of the second shift-stage 200(2) to which the inverted signal QB[2] is applied to the gate terminal remains in a turned-off state, the connection between the pull-up terminal of the first inverter 221 of the second shift-stage 200(2) and the supply voltage VDD becomes opened. That is, the pull-up terminal of the first inverter 221 of the second shift-stage 200(2) becomes floated. However, because the first NMOS transistor MN21 of the second shift-stage 200(2) remains in a turned-on state and the second NMOS transistor MN22 of the second shift-stage 200(2) is turned on, the logic level of the first shift output signal Q[1] applied to the output line 420 of the second shift-stage 200(2) is maintained at a low level "L". Similar to the first NMOS transistor MN01 and the second NMOS transistor MN02 of the pre-stage 100, the first NMOS transistor MN21 and the second NMOS transistor MN22 of the second shift-stage 200(2) prevents the output line 420 of the second shift-stage 200(2) from being floated when the inverted signal QB[0] is at a low level "L" and the pull-up terminal of the first inverter 221 is floated.

As the logic level of the second shift output signal Q[1] output from the second shift-stage 200(2) is maintained at a low level "L", the shift-stages following the second shift-stage 200(2) output signals at the same logic level as before the second time T12. Accordingly, the odd-numbered shift-stages following the second shift-stage 200(2) output inverted signals of a high level "H". For example, in a case of the third shift-stage 200(3), because the pull-up terminal of the first inverter 231 is directly coupled to the supply voltage VDD and the first inverter 231 receives the second shift output signal Q[1] of a low level "L" from the second shift-stage 200(2), an inverted signal of a high level "H" is output from the first inverter 231. Accordingly, the logic level of the inverted signal QB[2] applied to the output line 430 of the third shift-stage 200(3) is maintained at a high level "H". The even-numbered shift-stages following the second shift-stage 200(2) output shift output signals at a low level "L". Therefore, at the second time T12, among the shift output signals output from the shift register 10, only the first shift output signal Q[0] is at a high level "H" and all of the remaining shift output signals except for the first shift output signal Q[0] are at a low level "L".

Figure 8:
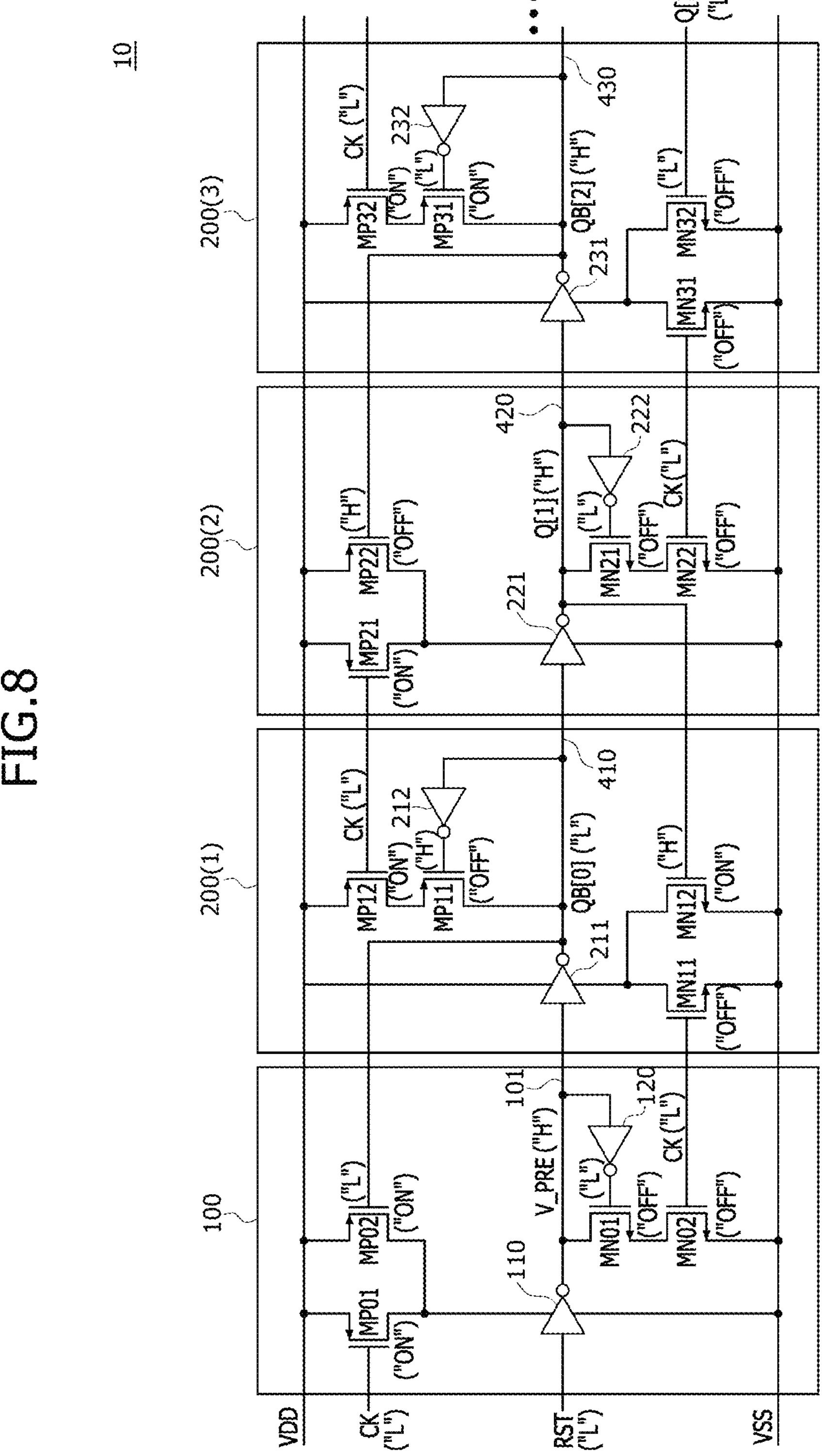
FIG. 8 is a circuit diagram illustrating an operation of a shift register according to an embodiment of the present disclosure.

FIG. 8 is a circuit diagram illustrating an operation of a shift register according to an embodiment of the present disclosure, for example, as shown in FIG. 2. Specifically, FIG. 8 is a circuit diagram illustrating the operation of a shift register at third time T13 when a second edge of a clock signal occurs after the first time T11, when a logic level of a pre-voltage signal transitioned from a low level to a high level in the timing diagram of FIG. 3.

Referring to FIG. 8 together with FIG. 2 and FIG. 3, the third time T13 is a time when a second edge of the clock signal CK occurs and when the logic level of the clock signal CK transitions from a high level "H" to a low level "L", that is, a first falling edge occurs after the first time T11, when the logic level of the pre-voltage signal V_PRE transitioned from a low level "L" to a high level "H". At the third time T13, the states of the second PMOS transistor MP12 of the first shift-stage 200(1), the first PMOS transistor MP21 of the second shift-stage 200(2), and the second PMOS transistor MP32 of the third shift-stage 200(3) that receive the clock signal CK of a low level "L" through the gate terminals are changed from a turned-off state into a turned-on state. On the other hand, the states of the second NMOS transistor MN02 of the pre-stage 100, the first NMOS transistor MN11 of the first shift-stage 200(1), the second NMOS transistor MN22 of the second shift-stage 200(2), and the first NMOS transistor MN31 of the third shift-stage 200(3) that receive the clock signal CK of a low level "L" through the gate terminals are changed from a turned-on state to a turned-off state.

Because the state of the first PMOS transistor MP01 of the pre-stage 100 is changed from a turned-off state to a turned-on state and the second PMOS transistor MP02 of the pre-stage 100, to which the inverted signal QB[0] of a low level "L" is applied to the gate terminal, is in a turned-on state, the supply voltage VDD is applied to the pull-up terminal of the first inverter 110 of the pre-stage 100. As the reset signal RST of a low level "L" is transmitted to the input terminal of the first inverter 110, the first inverter 110 outputs an inverted signal of a high level "H". Therefore, the logic level of the pre-voltage signal V_PRE applied to the output line 101 of the pre-stage 100 is maintained at a high level "H". As the first NMOS transistor MN01 to which the signal of a low level "L" output from the second inverter 120 of the pre-stage 100 is applied through the gate terminal is in a turned-off state and the second NMOS transistor MN02 is turned off, the connection between the output line 101 of the pre-stage 100 and the ground voltage VSS opens.

At the third time T13, when the second PMOS transistor MP22 of the second shift-stage 200(2) is turned off but the first PMOS transistor MP21 of the second shift-stage 200(2) is turned on, the first inverter 221 of the second shift-stage 200(2), to which the inverted signal QB[0] of low level “L” is input, outputs an inverted signal of a high level “H”. Accordingly, the logic level of the second shift output signal Q[1] applied to the output line 420 of the second shift-stage 200(2) is changed from a low level “L” to a high level “H”. As the logic level of the second shift output signal Q[1] applied to the output line 420 of the second shift-stage 200(2) becomes a high level “H”, the second NMOS transistor MN12 of the first shift-stage 200(1) is turned on. As the second NMOS transistor MN12 of the first shift-stage 200(1) is turned on, the ground voltage VSS is applied to the pull-down terminal of the first inverter 211 of the first shift-stage 200(1).

The first inverter 211 of the first shift-stage 200(1), which receives the pre-voltage signal V_PRE of a high level “H” output from the pre-stage 100, outputs the ground voltage VSS applied to the pull-down terminal, that is, an inverted signal of a low level “L”. Accordingly, the logic level of the inverted signal QB[0] applied to the output terminal of the first shift-stage 200(1) is maintained at a low level “L”. Because the second PMOS transistor MP12 of the first shift-stage 200(1) is turned on but the first PMOS transistor MP11 remains the turned-off state, the connection between the output line 410 of the first shift-stage 200(1) and the supply voltage VDD becomes opened.

At the third time T13, as the logic level of the second shift output signal Q[1] applied to the output line 420 of the second shift-stage 200(2) changes from a low level “L” to a high level “H”, the second inverter 222 of the second shift-stage 200(2) outputs a signal of a low level “L”. The first NMOS transistor MN21 of the second shift-stage 200(2), to which a signal of a low level “L” from the second inverter 222 is applied to the gate terminal, is turned off. As both the first NMOS transistor MN21 and the second NMOS transistor MN22 of the second shift-stage 200(2) are turned off, the connection between the output line 420 of the second shift-stage 200(2) and the ground voltage VSS opens.

At the third time T13, as the logic level of the second shift output signal Q[1] input to the first inverter 231 of the third shift-stage 200(3) changes from a low level “L” to a high level “H”, the first inverter 231 of the third shift-stage 200(3) outputs a voltage that is applied at the pull-down terminal of the first inverter 231. Because the first NMOS transistor MN31 of the third shift-stage 200(3) is turned off and the second NMOS transistor MN32 is in a turned-off state, the pull-down terminal of the first inverter 231 of the third shift-stage 200(3) becomes floated. Accordingly, the output terminal of the first inverter 231 of the third shift-stage 200(3) also becomes floated. However, because the first PMOS transistor MP31 of the third shift-stage 200(3) is in a turned-on state and the second PMOS transistor MP32 is turned on, the logic level of the inverted signal QB[2] applied to the output line 430 of the third shift-stage 200(3) is maintained at a high level “H”.

As the logic level of the inverted signal QB[2] output from the third shift-stage 200(3) is maintained at a high level “H”, the shift-stages following the third shift-stage 200(3) output signals of the same logic level as before the third time T13. Accordingly, the odd-numbered shift-stages following the third shift-stage 200(3) output inverted signals of a high level “H”. The even-numbered shift-stages following the third shift-stage 200(3) output shift output signals of a low level “L”. Therefore, at third time T13, among the shift output signals output from the shift register 10, only the first shift output signal Q[0] and the second shift output signal Q[1] are at a high level “H”, and all of the remaining shift output signals except the first shift output signal Q[0] and the second shift output signal Q[1] are at a low level “L”.

Figure 9:
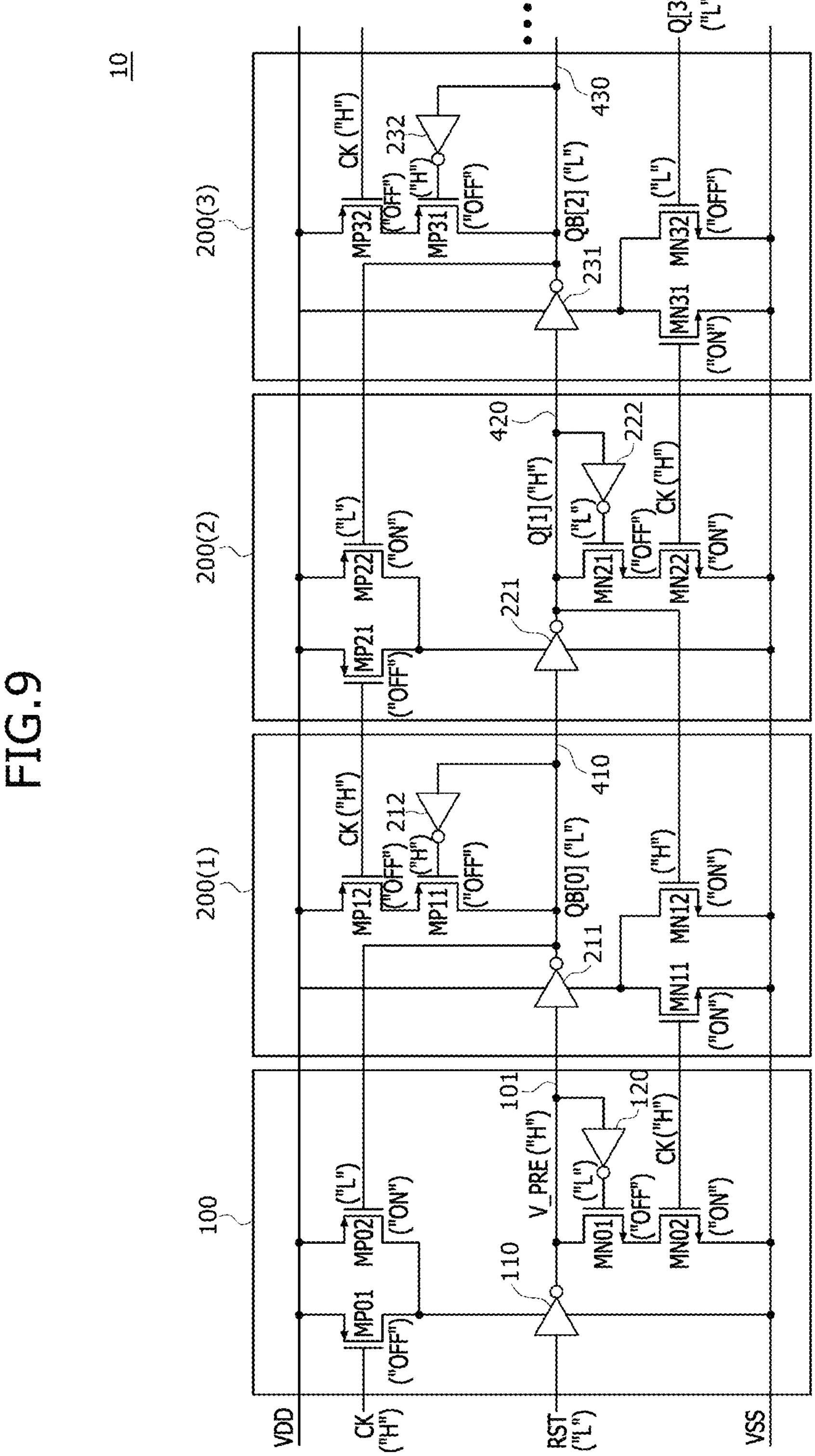
FIG. 9 is a circuit diagram illustrating an operation of a shift register according to an embodiment of the present disclosure.

FIG. 9 is a circuit diagram illustrating an operation of a shift register according to an embodiment of the present disclosure, for example, as shown in FIG. 2. Specifically, FIG. 9 is a circuit diagram illustrating the operation of a shift register at fourth time T14 when a third edge of a clock signal occurs after first time T11, which is when a logic level of a pre-voltage signal transitioned from a low level to a high level in the timing diagram of FIG. 3.

Referring to FIG. 9 together with FIG. 2 and FIG. 3, the fourth time T14 is the time when a third edge when the logic level of the clock signal CK transitions from a low level “L” to a high level “H”, that is, a second rising edge occurs after the first time T11, which is when the logic level of the pre-voltage signal V_PRE transitioned from a low level “L” to a high level “H”. At the fourth time T14, the states of the first PMOS transistor MP01 of the pre-stage 100, the second PMOS transistor MP12 of the first shift-stage 200(1), the first PMOS transistor MP21 of the second shift-stage 200(2), and the second PMOS transistor MP32 of the third shift-stage 200(3) that receive the clock signal CK of a high level “H” through the gate terminals are all changed from a turned-on state to a turned-off state. In addition, the states of the second NMOS transistor MN02 of the pre-stage 100, the first NMOS transistor MN11 of the first shift-stage 200(1), the second NMOS transistor MN22 of the second shift-stage 200(2), and the first NMOS transistor MN31 of the first shift-stage 200(3) are all changed from a turned-off state to a turned-on state.

The first inverter 211 of the first shift-stage 200(1) that receives the pre-voltage signal V_PRE of a high level “H” from the pre-stage 100 outputs a voltage applied at the pull-down terminal of the first inverter 211. As the first NMOS transistor MN11 of the first shift-stage 200(1) is turned on and the second NMOS transistor MN12 is in a turned-on state, the ground voltage VSS is applied to the pull-down terminal of the first inverter 211 of the first shift-stage 200(1). Accordingly, the first inverter 211 of the first shift-stage 200(1) outputs an inverted signal of a low level “L”. That is, the logic level of the inverted signal QB[0] applied to the output line 410 of the first shift-stage 200(1) is maintained at a low level “L”. The logic level of the first shift output signal Q[0] output from the shift register 10 is maintained at a high level “H”.

The second PMOS transistor MP02 of the pre-stage 100, which receives, through a gate terminal, the inverted signal QB[0] of a low level “L” applied to the output line 410 of the first shift-stage 200(1), is turned on, and accordingly, the supply voltage VDD is applied to the pull-up terminal of the first inverter 110 of the pre-stage 100. Accordingly, the first inverter 110 of the pre-stage 100, which receives the reset signal RST of a low level “L” through the input terminal, outputs an inverted signal of a high level “H” through the output terminal. Therefore, the logic level of the pre-voltage signal V_PRE applied to the output line 101 of the pre-stage 100 is maintained at a high level “H”. The output signal of the second inverter 120 of the pre-stage 100 is also maintained at a low level “L”, and accordingly, the first NMOS transistor MN01 of the pre-stage 100 is maintained in a turned-off state.

Because the logic level of the inverted signal QB[0] applied to the output line 410 of the first shift-stage 200(1) is maintained at a low level "L", the logic level of the signal transmitted to the first PMOS transistor MP11 from the second inverter 212 of the first shift-stage 200(1) is also maintained at a high level "H". Accordingly, the first PMOS transistor MP11 of the first shift-stage 200(1) is maintained in a turned-off state. Because the first PMOS transistor MP11 of the first shift-stage 200(1) is turned off and the second PMOS transistor MP12 is maintained in a turned-off stage, the connection between the output line 410 of the first shift-stage 200(1) and the supply voltage VDD becomes opened.

At the fourth time T14, as the second NMOS transistor MN32 of the third shift-stage 200(3) is in a turned-off state but the first NMOS transistor MN31 is turned on, the first inverter 231 of the third shift-stage 200(3), to which the second shift output signal Q[1] of a high level "H" is input, outputs an inverted signal of a low level "L". Accordingly, the logic level of the inverted signal QB[2] applied to the output line 430 of the third shift-stage 200(3) is changed from a high level "H" to a low level "L". As the logic level of the inverted signal QB[2] applied to the output line 430 of the third shift-stage 200(3) becomes a low level "L", the second PMOS transistor MP22 of the second shift-stage 200(2) is turned on. Although the first PMOS transistor MP21 of the second shift-stage 200(2) is turned off, as the second PMOS transistor MP22 is turned on, the supply voltage VDD is applied to the pull-up terminal of the first inverter 221 of the second shift-stage 200(2).

The first inverter 221 of the second shift-stage 200(2), which receives the inverted signal QB[0] of a low level "L" through an inverter, outputs the supply voltage VDD applied to its pull-up terminal, that is, an inverted signal of a high level "H" through an output terminal. Accordingly, the logic level of the second shift output signal Q[1] applied to the output line 420 of the second shift-stage 200(2) is maintained at a high level "H". In addition, the logic level of a signal output from the second inverter 222 of the second shift-stage 200(2) is also maintained at a low level "L". Although the second NMOS transistor MN22 of the second shift-stage 200(2) is turned on, as the first NMOS transistor MN21 is maintained at a turned-off state, the connection between the output line 420 of the second shift-stage 200(2) and the ground voltage VSS becomes opened.

As the second shift output signal Q[1] of a high level "H" is input from the second shift-stage 200(2) and the first NMOS transistor MN31 of the third shift-stage 200(3) is turned on, the first inverter 231 of the third shift-stage 200(3) outputs an inverted signal of a low level "L". Therefore, the logic level of the inverted signal QB[2] applied to the output line 430 of the third shift-stage 200(3) is changed from a high level "H" to a low level "L". In addition, the logic level of the third shift output signal Q[2] output from the shift register 10 is changed from a low level "L" to a high level "H".

As the logic level of the inverted signal QB[2] applied to the output line 430 of the third shift-stage 200(3) is changed to a low level "L", the logic level of a signal output from the second inverter 232 of the third shift-stage 200(3) is changed from a low level "L" to a high level "H". Accordingly, the first PMOS transistor MP31 of the third shift-stage 200(3) is turned off. As both the first PMOS transistor PM31 and the second PMOS transistor MP32 of the third shift-stage 200 (3) are turned off, the connection between the output line 430 of the third shift-stage 200(3) and the supply voltage VDD becomes opened.

The logic level of the inverted signal QB[2] output from the third shift-stage 200(3) is changed from a high level "H" to a low level "L", but the logic level of the fourth shift output signal Q[3] output from the fourth shift-stage is maintained at a low level "L". As with the second shift-stage 200(2) at the second time T12 described with reference to FIG. 7, a connection state of the output line of the fourth shift-stage and the ground voltage VSS is short-circuited, and therefore, the logic level of the fourth shift output signal Q[3] applied to the output line of the fourth shift-stage is maintained at a low level "L". In this way, at the fourth time T14, although the logic level of the inverted signal QB[2] output from the third shift-stage 200(3) is changed from a high level "H" to a low level "L", the shift-stages following the third shift-stage 200(3) output signals of the same logic level as before the fourth time T14. Accordingly, the odd-numbered shift-stages following the third shift-stage 200(3) output inverted signals of a high level "H". The even-numbered shift-stages following the third shift-stage 200(3) output shift output signals of a low level "L". Therefore, at the fourth time T14, among the shift output signals output from the shift register 10, only the first shift output signal Q[0], the second shift output signal Q[1], and the third shift output signal Q[2] are at a high level "H", and the remaining shift output signals are all at a low level "L".

Figure 10:
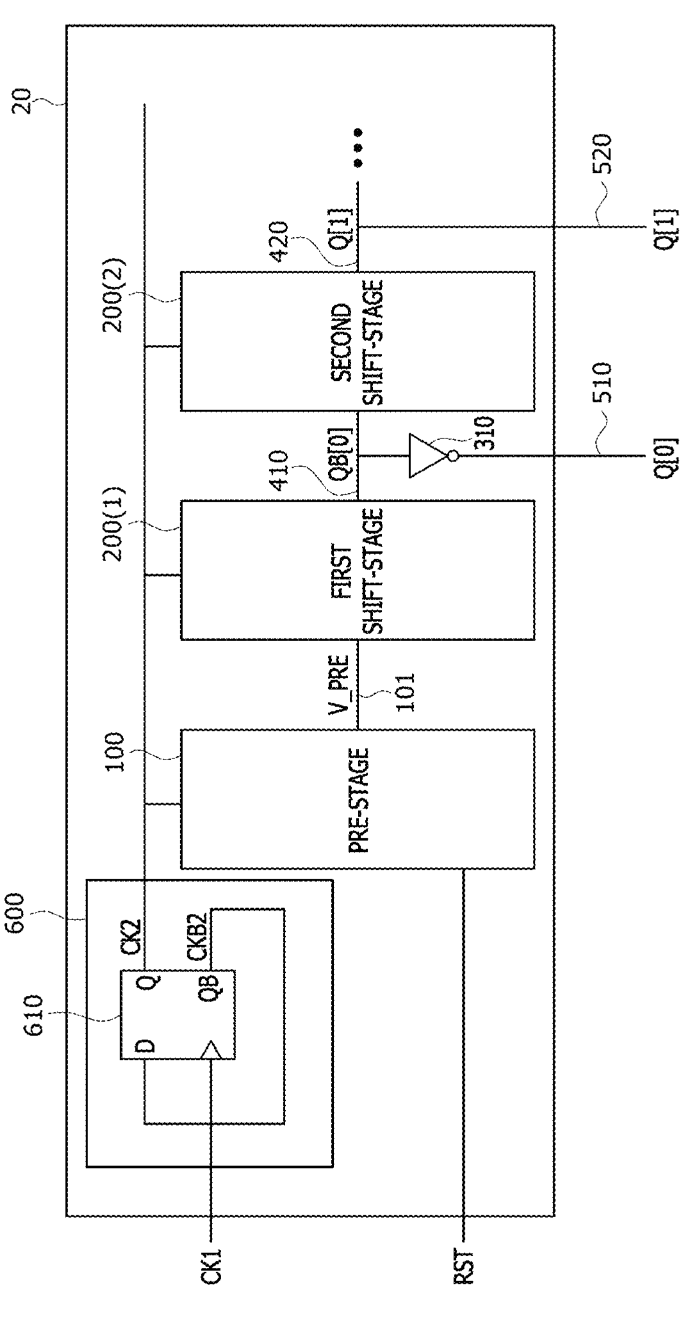
FIG. 10 is a block diagram illustrating a shift register according to an embodiment of the present disclosure.

FIG. 10 is a block diagram illustrating a shift register according to an embodiment of the present disclosure.

Referring to FIG. 10, a shift register 20 is different from the shift register 10 that performs the edge-based shifting operations in that the shift register 20 performs clock-based shifting operations using a clock signal processed with a clock division circuit. The shift register 20 includes a pre-stage 100, a plurality of shift-stages 200(1), 200(2), . . . , and a clock division circuit 600. As described with reference to FIG. 1, the pre-stage 100 transmits a pre-voltage signal V_PRE to the first shift-stage 200(1) through an output line 101. Among the plurality of shift-stages 200(1), 200(2), . . . , odd-numbered shift-stages, for example, the first shift-stage 200(1) outputs an inverted signal QB[0] through an output line 410. The inverted signal QB[0] output from the first shift-stage 200(1) is transmitted to the second shift-stage 200(2) and an output inverter 310. The output inverter 310 outputs a first shift output signal Q[0] through a first shift output line 510 of the shift register 20. Among the plurality of shift-stages 200(1), 200(2), . . . , even-numbered shift-stages, for example, the second shift-stage 200(2) outputs a second shift output signal Q[1] through an output line 420. The second shift output signal Q[1] output from the second shift-stage 200(2) is transmitted to a third shift-stage and is output from the shift register 20 through a second shift output line 520 of the shift register 20.

The shift register 20 receives a first clock signal CK1 and a reset signal RST. In an embodiment, the first clock signal CK1 may be a clock signal provided from an external circuit of the shift register 20, for example, a reference clock signal generating circuit. The first clock signal CK1 is input to the clock division circuit 600. The reset signal RST is transmitted to the pre-stage 100. The clock division circuit 600 includes a D flip-flop 610. In an embodiment, a D flip-flop is used as an example of the flip-flop included in the clock division circuit 600, but the present disclosure is not limited thereto. For example, the clock division circuit 600 may include a J-K flip-flop or other types of flip-flops.

The D flip-flop 610 of the clock division circuit 600 has a clock terminal, an input terminal D, an output terminal Q, and an inverted output terminal QB. The D flip-flop 610 receives the first clock signal CK1 through the clock terminal. The D flip-flop 610 outputs a second clock signal CK2 and an inverted second clock signal CKB2 through the output terminal Q and the inverted output terminal QB, respectively. The input terminal D and the inverted output terminal QB of the D flip-flop 610 are directly connected to each other. That is, the inverted second clock signal CKB2 output from the inverted output terminal QB of the D flip-flop 610 is fed back to the input terminal D of the D flip-flop 610. Therefore, a cycle of the second clock signal CK2 output through the output terminal Q of the D flip-flop 610 is twice the cycle of the first clock signal CK1 transmitted to the clock terminal of the D flip-flop 610. The second clock signal CK2 output from the D flip-flop 610 of the clock division circuit 600 is commonly transmitted to the pre-stage 100 and the plurality of shift-stages 200(1), 200(2), . . . etc.

Figure 11:
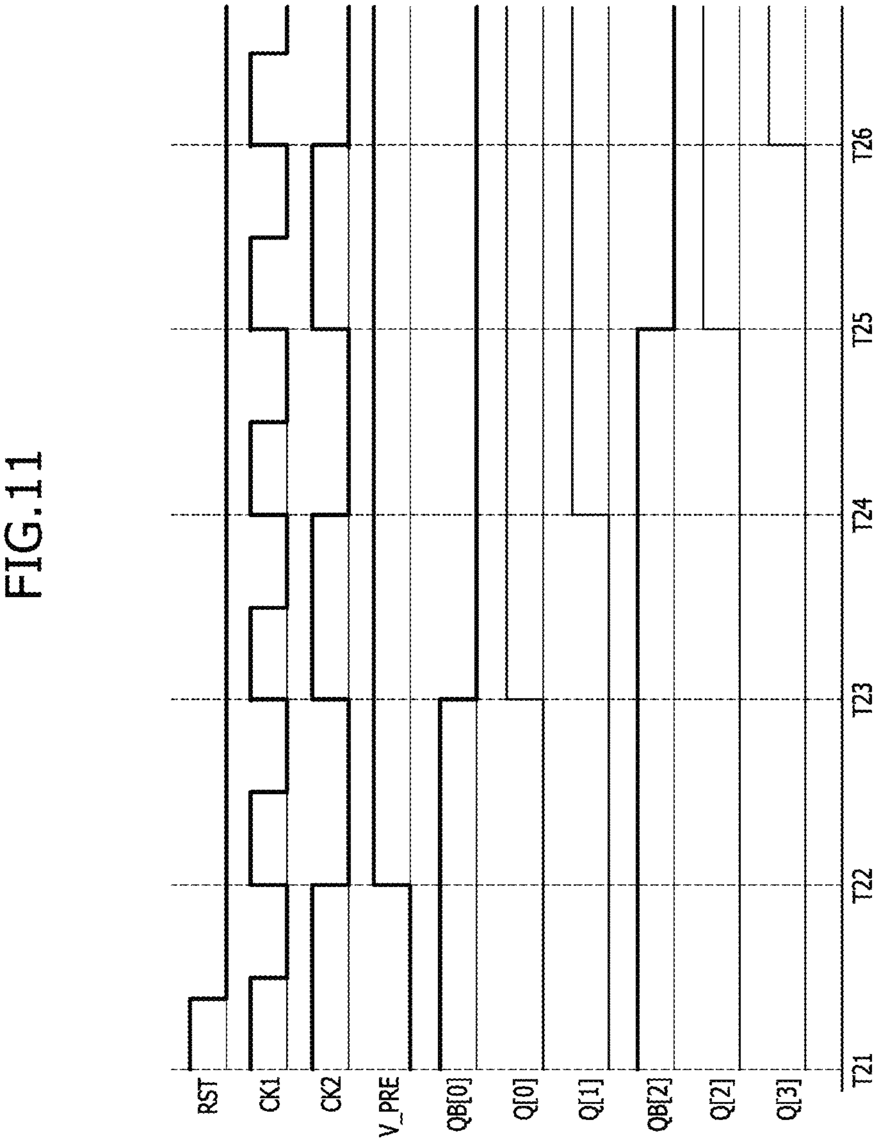
FIG. 11 is a timing diagram during an operation of a shift register according to an embodiment of the present disclosure.

FIG. 11 is a timing diagram during an operation of a shift register according to an embodiment of the present disclosure, for example, as shown in FIG. 10.

Referring to FIG. 11 together with FIG. 10, a shift register 20 performs a shifting operation whenever a rising edge and a falling edge of the second clock signal CK2 occur while a logic level of the pre-voltage signal V_PRE is at a high level. That is, the shift register 20 performs a clock-based shifting operation in which shifting is performed whenever a rising edge of the first clock signal CK1 occurs, after the logic level of the pre-voltage signal V_PRE changes to a high level. Therefore, unlike the shift register 10 described with reference to FIG. 1, the shift register 20 does not perform the shifting operation when a falling edge of the first clock signal CK1 occurs. In addition, the performance cycle of the shifting operation of the shift register 10 described with reference to FIG. 1 is ½ cycle of the first clock signal CK1, whereas the performance cycle of the shifting operation of the shift register 20 is 1 cycle of the first clock signal CK1.

As described with reference to FIG. 10, the cycle of the second clock signal CK2 output from the D flip-flop 610 of the clock division circuit 600 is twice that of the first clock signal CK1. That is, an edge of the second clock signal CK2 occurs for each cycle of the first clock signal CK1. As illustrated in FIG. 11, the second clock signal CK2 is maintained at a high level during the time period between first time T21 and second time T22, which is a first cycle of the first clock signal CK1. At the second time T22, when the first cycle of the first clock signal CK1 ends and a second cycle begins, a first edge at which the logic level of the second clock signal CK2 transitions from a high level to a low level, that is, a first falling edge occurs. During the time period between the second time T22 and third time T23, which is a second cycle of the first clock signal CK1, the second clock signal CK2 is maintained at a low level. At the third time T23, when the second cycle of the first clock signal CK1 ends and a third cycle begins, the second edge at which the logic level of the second clock signal CK2 transitions from a low level to a high level, that is, a first rising edge occurs. In the same manner, at fourth time T24 when the third cycle of the first clock signal CK1 ends and a fourth cycle begins, a third edge at which the logic level of the second clock signal CK2 transitions from a high level to a low level, that is, a second falling edge occurs. At fifth time T25 when the fourth cycle of the first clock signal CK1 ends and a fifth cycle begins, a fourth edge at which the logic level of the second clock signal CK2 transitions from a low level to a high level, that is, a second rising edge occurs. At sixth time T26 when the fifth cycle of the first clock signal CK1 ends and a sixth cycle begins, a fifth edge at which the logic level of the second clock signal CK2 transitions from a high level to a low level, that is, a third falling edge occurs.

The second time T22 is a time when the first edge at which the logic level of the second clock signal CK2 transitions from a high level to a low level occurs after the logic level of the reset signal RST is changed to a low level. At the second time T22, the logic level of the pre-voltage signal V_PRE output from the pre-stage 100 transitions from a low level to a high level. At the second time T22, all inverted signals output from the odd-numbered shift-stages are at a high logic level. For example, an inverted signal QB[0] output from the first shift-stage 200(1) is at a high level. Similarly, an inverted signal QB[2] output from the third shift-stage is also at a high level. Accordingly, at the second time T22, all shift output signals output from the odd-numbered shift-stages are at a low level. For example, a first shift output signal Q[0] and a third shift output signal Q[2] output from the shift register 20 are at a low level. At the second time T22, all shift output signals output from the even-numbered shift-stages are at a low level. For example, a second shift output signal Q[1] output from the second shift-stage 200(2) is at a low level. Similarly, a fourth shift output signal Q[3] output from the fourth shift-stage is also at a low level. The operation of the shift register 20 at the second time T22 is the same as the operation of the shift register 10 described with reference to FIG. 5.

The third time T23 is a time when the first edge at which the logic level of the second clock signal CK2 transitions from a low level to a high level, that is, the first rising edge occurs after the second time T22 when the logic level of the pre-voltage signal V_PRE output from the pre-stage 100 is changed to a high level. Additionally, the third time T23 is the time when a first rising edge at which the logic level of the first clock signal CK1 transitions from a low level to a high level after the second time T22. At the third time T23, the logic level of the pre-voltage signal V_PRE output from the pre-stage 100 is maintained at a high level. At the third time T23, among the odd-numbered shift-stages, the logic level of the inverted signal QB[0] output from the first shift-stage 200(1) is changed from a high level to a low level. At the third time T23, all of the inverted signals output from the odd-numbered shift-stages except for the first shift-stage 200(1) are maintained at a high level. For example, the inverted signal QB[2] output from the third shift-stage is maintained at a high level at the third time T23. Accordingly, at the third time T23, the logic level of the first shift output signal Q[0] among the odd-numbered shift output signals output from the shift register 20 is changed to a high level. The logic levels of the remaining odd-numbered shift output signals except for the first shift output signal Q[0] are maintained at a low level. For example, the logic level of the third shift output signal Q[2] output from the shift register 20 is maintained a low level. At the third time T23, all shift output signals output from the even-numbered shift-stages are maintained at a low level. For example, the second shift output signal Q[1] output from the second shift-stage 200(2) is maintained at a low level. Similarly, the fourth shift output signal Q[3] output from the fourth shift-stage is also maintained at a low level. The operation of the shift register 20 at the third time T23 is the same as the operation of the shift register 10 described with reference to FIG. 7.

The fourth time T24 is a time when the second edge at which the logic level of the second clock signal CK2 transitions from a high level to a low level, that is, the first falling edge occurs after the second time T22, which is when the logic level of the pre-voltage signal V_PRE output from the pre-stage 100 changed to a high level. In addition, the fourth time T24 is a time after the second time T22 when the second rising edge at which the logic level of the first clock signal CK1 transitions from a low level to a high level. At the fourth time T24, the logic level of the pre-voltage signal V_PRE output from the pre-stage 100 is maintained at a high level. At the fourth time T24, the logic level of the inverted signal QB[0] output from the first shift-stage 200(1) among the odd-numbered shift-stages is maintained at a low level. In addition, all the inverted signals output from the remaining odd-numbered shift-stages except for the first shift-stage 200(1) are maintained at a high logic level. For example, the inverted signal QB[2] output from the third shift-stage is maintained at a high level at the fourth time T24. Accordingly, at the fourth time T24, the first shift output signal Q[0] among the odd-numbered shift output signals output from the shift register 20 is maintained at a high level, and the remaining odd-numbered shift output signals are all maintained at a low level. For example, the third shift output signal Q[2] output from the shift register 20 is maintained at a low level. At the fourth time T24, among the shift output signals output from the even-numbered shift-stages, the logic level of the second shift output signal Q[1] output from the second shift-stage 200(2) is changed from a low level to a high level. All shift output signals output from the remaining even-numbered shift-stages except for the second shift-stage 200(2) are maintained at a low level. For example, the fourth shift output signal Q[3] output from the fourth shift-stage is maintained at a low level. The operation of the shift register 20 at the fourth time T24 is the same as the operation of the shift register 10 described with reference to FIG. 8.

The fifth time T25 is a time when the third edge at which the logic level of the second clock signal CK2 transitions from a low level to a high level, that is, the second rising edge occurring after the second time T22, which is when the logic level of the pre-voltage signal V_PRE output from the pre-stage 100 changed to a high level. In addition, the fifth time T25 is the time when the third rising edge at which the logic level of the first clock signal CK1 transitions from a low level to a high level occurs after the second time T22. At the fifth time T25, the logic level of the pre-voltage signal V_PRE output from the pre-stage 100 is still maintained at a high level. At the fifth time T25, the logic level of the inverted signal QB[0] output from the first shift-stage 200(1) among the odd-numbered shift-stages is maintained at a low level. In addition, the logic level of the inverted signal QB[2] output from the third shift-stage is changed from a high level to a low level. At the fifth time T25, all inverted signals output from the odd-numbered shift-stages except for the first shift stage 200(1) and the third shift-stage are maintained at a high level. Accordingly, at the fifth time T25, among the odd-numbered shift output signals output from the shift register 20, the first shift output signal Q[0] is maintained at a high level and the logic level of the third shift output signal Q[2] is changed to a high logic level. All other odd-numbered shift output signals except for the first shift output signal Q[0] and the third shift output signal Q[2] are maintained at a low level. At the fifth time T25, the logic level of the second shift output signal output from the second shift-stage 200(2), among the shift output signals output from the even-numbered shift-stages, is maintained at a high level. In addition, the logic levels of the remaining even-numbered shift output signals except for the second shift output signal are maintained at a low level. For example, the fourth shift output signal Q[3] output from the fourth shift-stage is maintained at a low level. The operation of the shift register 20 at the fifth time T25 is the same as the operation of the shift register 10 described with reference to FIG. 9.

The sixth time T26 is a time when the fourth edge at which the logic level of the second clock signal CK2 transitions from a high level to a low level, that is, the second falling edge occurs after the second time T22, which is when the logic level of the pre-voltage signal V_PRE output from the pre-stage 100 changed to a high level. In addition, the sixth time T26 is a time after the second time T22 when the fourth rising edge at which the logic level of the first clock signal CK1 transitions from a low level to a high level. At the sixth time T26, the logic level of the pre-voltage signal V_PRE output from the pre-stage 100 is still maintained at a high level.

At the sixth time T26, the logic level of the inverted signal QB[0] output from the first shift-stage 200(1) among the odd-numbered shift-stages is maintained at a low level. In addition, the logic level of the inverted signal QB[2] output from the third shift-stage 200(3) is also maintained at a low level. On the other hand, although not shown in FIG. 11, at the sixth time T26, all inverted signals output from the odd-numbered shift-stages except for the first shift-stage 200(1) and the third shift-stage are maintained at a high level. Accordingly, at the sixth time T26, only the logic levels of the first shift output signal Q[0] and the third shift output signal Q[2] are maintained at a high level, and the logic levels of the remaining odd-numbered shift output signals are maintained at a low level.

At the sixth time T26, the logic level of the second shift output signal Q[1] output from the second shift-stage 200(2) among the even-numbered shift-stages is maintained at a high level. The logic level of the fourth shift output signal Q[3] output from the fourth shift-stage is changed from a low level to a high level. Accordingly, at the sixth time T26, the logic levels of all even-numbered shift output signals except for the second shift output signal Q[1] and the fourth shift output signal Q[3] among the even-numbered shift output signals are maintained at a low level.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A shift register comprising:

a pre-stage configured to output a pre-voltage signal based on a clock signal and a reset signal; and "N" shift-stages configured to receive the clock signal, and output "N" output signals, respectively, wherein "N" is a natural number equal to or greater than 2, wherein the pre-stage and the "N" shift-stages are coupled in a daisy-chain form, wherein odd-numbered shift-stages among the "N" shift-stages are configured with a first circuit structure, and wherein even-numbered shift-stages among the "N" shift-stages are configured with a second circuit structure, which differs from the first circuit structure.

2. The shift register of claim 1, wherein the pre-stage is configured with the second circuit structure.

3. The shift register of claim 1, wherein the pre-voltage signal output from the pre-stage is input to a first shift-stage among the "N" shift-stages, and wherein when "M" is a natural number greater than or equal to "1" and less than or equal to "N−1", an output signal output from an "M"$^{th}$ shift-stage among the "N" shift-stages is input to an "M+1"$^{th}$ shift-stage.

4. The shift register of claim 1, further comprising "N" shift output lines that output "N" shift output signals, respectively.

5. The shift register of claim 4, wherein the odd-numbered shift-stages are configured to output inverted signals of odd-numbered shift output signals, respectively, from among the "N" shift output signals, and wherein the even-numbered shift-stages are configured to output even-numbered shift output signals, respectively, from among the "N" shift output signals.

6. The shift register of claim 5, further comprising "N/2" output inverters configured to receive inverted signals of the odd-numbered shift output signals, respectively and output the odd-numbered shift output signals, respectively.

7. The shift register of claim 1, wherein the pre-stage comprises a first inverter configured to receive the reset signal through an input terminal and output an inverted signal through an output terminal, and wherein the output terminal of the first inverter is coupled to an output line of the pre-stage through which the pre-voltage signal is output.

8. The shift register of claim 7, wherein the first inverter comprises a pull-up terminal and a pull-down terminal, wherein the pull-up terminal is enabled when a logic level of the reset signal is at a low level, and wherein the pull-down terminal is enabled when the logic level of the reset signal is at a high level.

9. The shift register of claim 8, wherein the pre-stage further comprises a first P-channel type MOS (PMOS) transistor and a second PMOS transistor that are disposed in parallel between the pull-up terminal and a supply voltage.

10. The shift register of claim 9, wherein the first PMOS transistor comprises a gate terminal to which the clock signal is applied, a source terminal coupled to the supply voltage, and a drain terminal coupled to the pull-up terminal of the first inverter, wherein the second PMOS transistor comprises a gate terminal to which an output signal, applied to an output line of a first shift-stage among the "N" shift-stages, is applied, a source terminal coupled to the supply voltage, and a drain terminal coupled to the pull-up terminal of the first inverter, and wherein the pull-down terminal of the first inverter is directly coupled to a ground voltage.

11. The shift register of claim 8, wherein the pre-stage further comprises:

a first N-channel type MOS (NMOS) transistor and a second NMOS transistor that are disposed in series between the output line of the pre-stage and a ground voltage, and a second inverter disposed between the first NMOS transistor and the output line of the pre-stage.

12. The shift register of claim 11, wherein the second inverter comprises an input terminal coupled to the output line of the pre-stage and an output terminal coupled to a gate terminal of the first NMOS transistor, wherein the first NMOS transistor comprises the gate terminal coupled to the output terminal of the second inverter, a drain terminal coupled to the output line of the pre-stage, and a source terminal coupled to a drain terminal of the second NMOS transistor, and wherein the second NMOS transistor comprises a gate terminal to which the clock signal is applied, the drain terminal coupled to the source terminal of the first NMOS transistor, and a source terminal coupled to the ground voltage.

13. The shift register of claim 1, wherein the pre-stage is configured to change a logic level of the pre-voltage signal from a low level to a high level at first time at a first falling edge of the clock signal when a logic level of the clock signal is changed from a high level to a low level, after a logic level of the reset signal is changed from a high level to a low level.

14. The shift register of claim 13, wherein the pre-stage is configured to maintain a logic level of the pre-voltage signal at a high level.

15. The shift register of claim 14, further comprising "N" shift output lines that output "N" shift output signals, wherein a first shift-stage among the "N" shift-stages is configured to output an inverted signal of a first shift output signal among the "N" shift output signals through an output line of the first shift-stage, wherein the first shift-stage comprises a first inverter configured to receive, through an input terminal, the pre-voltage signal output from the pre-stage and output the inverted signal through an output terminal, and wherein the output terminal of the first inverter of the first shift-stage is coupled to the output line of the first shift-stage.

16. The shift register of claim 15, wherein the first inverter of the first shift-stage comprises a pull-up terminal and a pull-down terminal, wherein the pull-up terminal is enabled when a logic level of the pre-voltage signal is at a low level, and wherein the pull-down terminal is enabled when the logic level of the pre-voltage signal is at a high level.

17. The shift register of claim 16, wherein the first shift-stage further comprises a first NMOS transistor and a second NMOS transistor that are disposed in parallel between the pull-down terminal of the first inverter of the first shift-stage and a ground voltage.

18. The shift register of claim 17, wherein the first NMOS transistor of the first shift-stage comprises a gate terminal to which the clock signal is applied, a source terminal coupled to the ground voltage, and a drain terminal coupled to the pull-down terminal of the first inverter of the first shift-stage, wherein the second NMOS transistor of the first shift-stage comprises a gate terminal to which an output signal, applied to an output line of a second shift-stage from among the "N" shift-stages, is applied, a source terminal coupled to the ground voltage, and a drain terminal coupled to the pull-down terminal of the first inverter of the first shift-stage, and wherein the pull-up terminal of the first inverter of the first shift-stage is directly coupled to a supply voltage.

19. The shift register of claim 16, wherein the first shift-stage further comprises:

a first PMOS transistor and a second PMOS transistor that are disposed in series between the output line of the first shift-stage and a supply voltage, and a second inverter disposed between the first PMOS transistor and the output line of the first shift-stage.

20. The shift register of claim 19, wherein the second inverter of the first shift-stage comprises an input terminal coupled to the output line of the first shift-stage and an output terminal coupled to a gate terminal of the first PMOS transistor of the first shift-stage, wherein the first PMOS transistor of the first shift-stage comprises the gate terminal coupled to the output terminal of the second inverter of the first shift-stage, a drain terminal coupled to the output line of the first shift-stage, and a source terminal coupled to a drain terminal of the second PMOS transistor of the first shift-stage, and wherein the second PMOS transistor of the first shift-stage comprises a gate terminal to which the clock signal is applied, the drain terminal coupled to the source terminal of the first PMOS transistor of the first shift-stage, and a source terminal coupled to the supply voltage.

21. The shift register of claim 1, further comprising "N" shift output lines that output "N" shift output signals, respectively, wherein a "P"*th* shift-stage ("P" is an odd number from 3 to "N") among the odd-numbered shift-stages is configured to output an inverted signal of a "P"*th* shift output signal among the "N" shift output signals through an output line of the "P"*th* shift-stage, wherein the "P"*th* shift-stage comprises a first inverter configured to receive an output signal from a "P−1"*th* shift-stage through an input terminal and output an inverted signal through an output terminal, and wherein the output terminal of the first inverter of the "P"*th* shift-stage is coupled to the output line of the "P"*th* shift-stage from which the inverted signal is output.

22. The shift register of claim 21, wherein the first inverter of the "P"*th* shift-stage comprises a pull-up terminal and a pull-down terminal, wherein the pull-up terminal is enabled when a logic level of the output signal from the "P−1"*th* shift-stage is at a low level, and wherein the pull-down terminal is enabled when the logic level of the output signal from the "P−1"*th* shift-stage is at a high level.

23. The shift register of claim 22, wherein the "P"*th* shift-stage further comprises a first NMOS transistor and a second NMOS transistor that are disposed in parallel between the pull-down terminal of the first inverter and a ground voltage.

24. The shift register of claim 23, wherein the first NMOS transistor of the "P"*th* shift-stage comprises a gate terminal to which the clock signal is applied, a source terminal coupled to the ground voltage, and a drain terminal coupled to the pull-down terminal of the first inverter of the "P"*th* shift-stage, wherein the second NMOS transistor of the "P"*th* shift-stage comprises a gate terminal to which an output signal applied to an output line of a "P+1"*th* shift-stage is applied, a source terminal coupled to the ground voltage, and a drain terminal coupled to the pull-down terminal of the first inverter of the "P"*th* shift-stage, and wherein the pull-up terminal of the first inverter of the "P"*th* shift-stage is directly coupled to a supply voltage.

25. The shift register of claim 22, wherein the "P"*th* shift-stage further comprises:

a first PMOS transistor and a second PMOS transistor that are disposed in series between the output line of the "P"*th* shift-stage and a supply voltage, and a second inverter disposed between the first PMOS transistor of the "P"*th* shift-stage and the output line of the "P"*th* shift-stage.

26. The shift register of claim 25, wherein the second inverter of the "P"*th* shift-stage comprises an input terminal coupled to the output line of the "P"*th* shift-stage and an output terminal coupled to a gate terminal of the first PMOS transistor of the "P"*th* shift-stage, wherein the first PMOS transistor comprises the gate terminal coupled to the output line of the second inverter of the "P"*th* shift-stage, a drain terminal coupled to the output line of the "P"*th* shift-stage, and a source terminal coupled to a drain terminal of the second PMOS transistor of the "P"*th* shift-stage, and wherein the second PMOS transistor of the "P"*th* shift-stage comprises a gate terminal to which the clock signal is applied, the drain terminal coupled to the source terminal of the first PMOS transistor of the "P"*th* shift-stage, and a source terminal coupled to the supply voltage.

27. The shift register of claim 1, further comprising "N" shift output lines that output "N" shift output signals, respectively, wherein a "Q"*th* shift-stage ("Q" is an even number from 2 to "N") among the even-numbered shift-stages is configured to output a "Q"*th* shift output signal among the "N" shift output signals through an output line of the "Q"*th* shift-stage, wherein the "Q"*th* shift-stage comprises a first inverter configured to receive an output signal from a "Q−1"*th* shift-stage through an input terminal and output an inverted signal through an output terminal, and wherein the output terminal of the first inverter of the "Q"*th* shift-stage is coupled to the output line of the "Q"*th* shift-stage from which the "Q"*th* shift output signal is output.

28. The shift register of claim 27, wherein the first inverter of the "Q"*th* shift-stage comprises a pull-up terminal and a pull-down terminal, wherein the pull-up terminal is enabled when a logic level of the output signal from the "Q−1"*th* shift-stage is at a low level, and wherein the pull-down terminal is enabled when the logic level of the output signal from the "Q−1"*th* shift-stage is at a high level.

29. The shift register of claim 28, wherein the "Q"*th* shift-stage further comprises a first PMOS transistor and a second PMOS transistor that are disposed in parallel between the pull-up terminal of the first inverter and a supply voltage.

30. The shift register of claim 29, wherein the first PMOS transistor of the "Q"*th* shift-stage comprises a gate terminal to which the clock signal is applied, a source terminal coupled to the supply voltage, and a drain terminal coupled to the pull-up terminal of the first inverter of the "Q"$^{th}$ shift-stage, wherein the second PMOS transistor of the "Q"$^{th}$ shift-stage comprises a gate terminal to which an output signal applied to an output line of a "Q+1"$^{th}$ shift-stage is applied, a source terminal coupled to the supply voltage, and a drain terminal coupled to the pull-up terminal of the first inverter of the "Q"$^{th}$ shift-stage, and wherein the pull-down terminal of the first inverter of the "Q"$^{th}$ shift-stage is directly coupled to a ground voltage.

31. The shift register of claim 28, wherein the "Q"$^{th}$ shift-stage further comprises:

a first NMOS transistor and a second NMOS transistor that are disposed in series between the output line of the "Q"$^{th}$ shift-stage and a ground voltage; and a second inverter disposed between the first NMOS transistor of the "Q"$^{th}$ shift-stage and the output line of the "Q"$^{th}$ shift-stage.

32. The shift register of claim 31, wherein the second inverter of the "Q"$^{th}$ shift-stage comprises an input terminal coupled to the output line of the "Q"$^{th}$ shift-stage and an output terminal coupled to a gate terminal of the first NMOS transistor of the "Q"$^{th}$ shift-stage, wherein the first NMOS transistor of the "Q"$^{th}$ shift-stage comprises the gate terminal coupled to the output terminal of the second inverter of the "Q"$^{th}$ shift-stage, a drain terminal coupled to the output line of the "Q"$^{th}$ shift-stage, and a source terminal coupled to a drain terminal of the second NMOS transistor of the "Q"$^{th}$ shift-stage, and wherein the second NMOS transistor of the "Q"$^{th}$ shift-stage comprises a gate terminal to which the clock signal is applied, the drain terminal coupled to the source terminal of the first NMOS transistor of the "Q"$^{th}$ shift-stage, and a source terminal coupled to the ground voltage.

* * * * *